United States Patent
Wei et al.

(10) Patent No.: US 11,621,231 B2
(45) Date of Patent: Apr. 4, 2023

(54) METHODS OF FABRICATING LEADLESS POWER AMPLIFIER PACKAGES INCLUDING TOPSIDE TERMINATIONS

(71) Applicant: NXP USA, Inc., Austin, TX (US)

(72) Inventors: Yun Wei, Chandler, AZ (US); Fernando A. Santos, Chandler, AZ (US); Lakshminarayan Viswanathan, Phoenix, AZ (US); Scott Duncan Marshall, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/659,379

(22) Filed: Apr. 15, 2022

(65) Prior Publication Data

US 2022/0238450 A1 Jul. 28, 2022

Related U.S. Application Data

(62) Division of application No. 17/077,583, filed on Oct. 22, 2020, now Pat. No. 11,342,275.

(51) Int. Cl.
*H01L 23/48* (2006.01)
*H01L 23/538* (2006.01)
*H01L 23/13* (2006.01)
*H01L 23/31* (2006.01)
*H01L 23/36* (2006.01)

(52) U.S. Cl.
CPC ......... *H01L 23/5389* (2013.01); *H01L 23/13* (2013.01); *H01L 23/3128* (2013.01); *H01L 23/36* (2013.01)

(58) Field of Classification Search
CPC ......... H01L 23/04; H01L 23/13; H01L 23/36; H01L 23/495; H01L 23/5389
USPC .......................... 257/666, 676, 728
See application file for complete search history.

(56) References Cited

U.S. PATENT DOCUMENTS

| | | | |
|---|---|---|---|
| 11,128,268 B1* | 9/2021 | Kishore | H01L 23/047 |
| 2005/0001294 A1* | 1/2005 | Li | H01L 24/49 257/E23.047 |
| 2008/0157302 A1* | 7/2008 | Lee | H01L 23/49548 257/676 |
| 2016/0254217 A1* | 9/2016 | Lu | H01L 24/97 257/675 |
| 2021/0328552 A1* | 10/2021 | Tucker | H03F 3/21 |
| 2021/0336585 A1* | 10/2021 | Mares | H01L 23/42 |
| 2021/0375525 A1* | 12/2021 | Kao | H01L 28/10 |

* cited by examiner

*Primary Examiner* — Nitin Parekh

(57) ABSTRACT

Leadless power amplifier (PA) packages and methods for fabricating leadless PA packages having topside terminations are disclosed. In embodiments, the method includes providing electrically-conductive pillar supports and a base flange. At least a first radio frequency (RF) power die is attached to a die mount surface of the base flange and electrically interconnected with the pillar supports. Pillar contacts are further provided, with the pillar contacts electrically coupled to the pillar supports and projecting therefrom in a package height direction. The first RF power die is enclosed in a package body, which at least partially defines a package topside surface opposite a lower surface of the base flange. Topside input/out terminals are formed, which are accessible from the package topside surface and which are electrically interconnected with the first RF power die through the pillar contacts and the pillar supports.

19 Claims, 12 Drawing Sheets

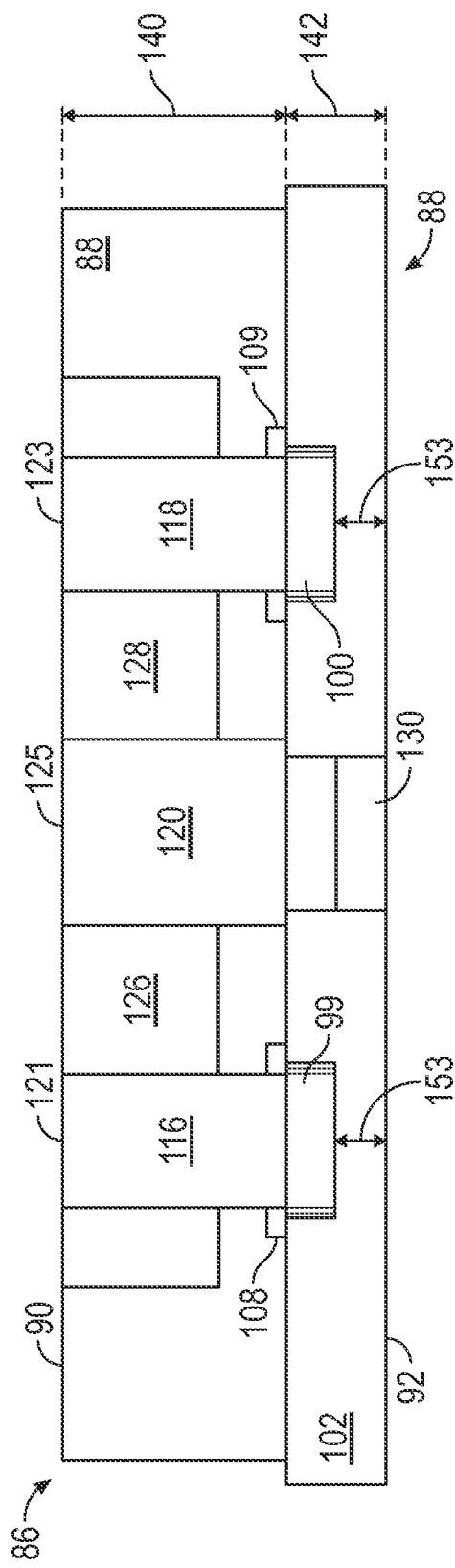
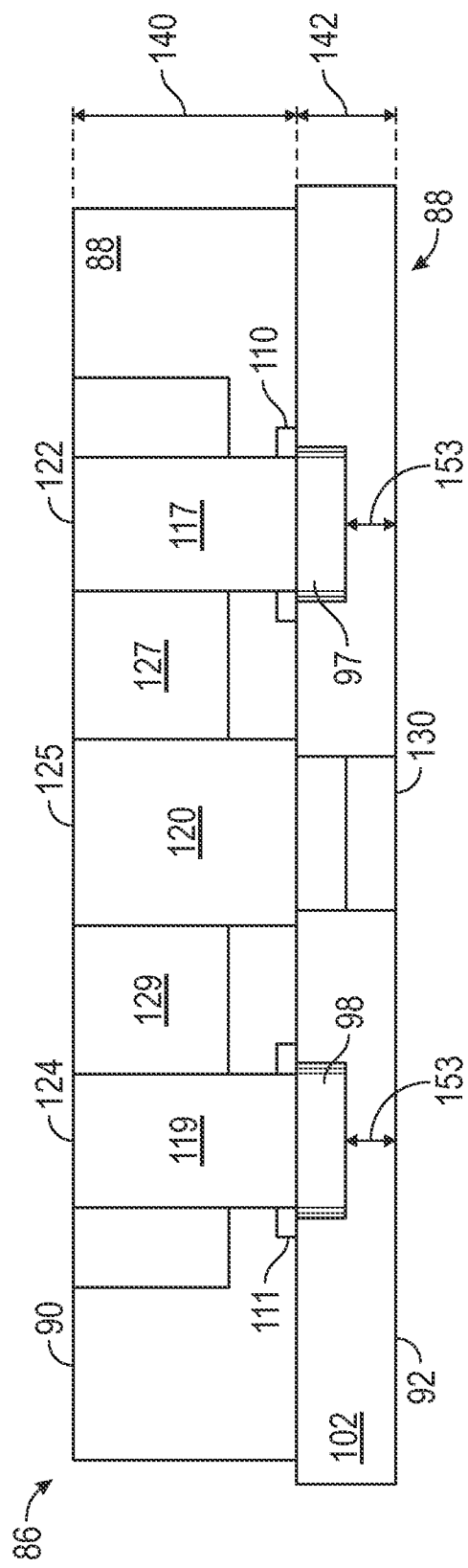

METHODS OF FABRICATING LEADLESS POWER AMPLIFIER PACKAGES INCLUDING TOPSIDE TERMINATIONS

CROSS REFERENCE TO RELATED APPLICATION

This application is a divisional of co-pending, U.S. patent application Ser. No. 17/077,583, filed on 22 Oct. 2020.

TECHNICAL FIELD

Embodiments of the present disclosure relate generally to microelectronics and, more particularly, to leadless power amplifier (PA) packages and methods for fabricating leadless PA packages having topside terminations.

BACKGROUND

A power amplifier (PA) package contains at least one semiconductor die bearing a transistor integrated circuit, which is utilized for radio frequency (RF) signal or power amplification purposes; herein, an "RF power die." In the case of a Doherty PA package, for example, at least one carrier RF power die and at least one peaking RF power die are contained within the body of the PA package. The carrier and peaking RF power dies may be mounted to an electrically-conductive substrate, such as a metallic base flange, which provides electrical contact to the respective backsides of the dies, while also potentially serving as a heatsink aiding in the dissipation of excess heat generated during operation of the RF power dies. In certain cases, the PA package may include a lid or cover piece enclosing an air cavity; the term "air cavity" referring to a sealed, gas-containing cavity by industry convention. In other instances, a PA package may be fabricated to lack such an air cavity and, instead, to contain a void-free encapsulant body in which the packaged RF power dies, any other packaged microelectronic components (e.g., surface mount devices), and wirebonds or other interconnect features are embedded. PA package of this latter type are commonly referred to as "encapsulated," "overmolded," or "plastic" packages, with the term "overmolded" principally used herein. As indicated above, the RF power die or dies contained within a PA package may be prone to excess heat generation during operation, particularly in the case of carrier RF power dies operated at higher radio frequencies (e.g., approaching or exceeding 3 Gigahertz) and dies fabricated utilizing a power dense technologies, such as layered gallium nitride die structures. If not adequately dissipated, such excess heat can accumulate within the PA package and limit performance of the RF power dies.

BRIEF DESCRIPTION OF THE DRAWINGS

At least one example of the present invention will hereinafter be described in conjunction with the following figures, wherein like numerals denote like elements, and:

FIGS. 5 and 6 are opposing side views of the example leadless PA package shown in FIGS. 2-4, with the overmolded package body shown in outline;

Figure 1:
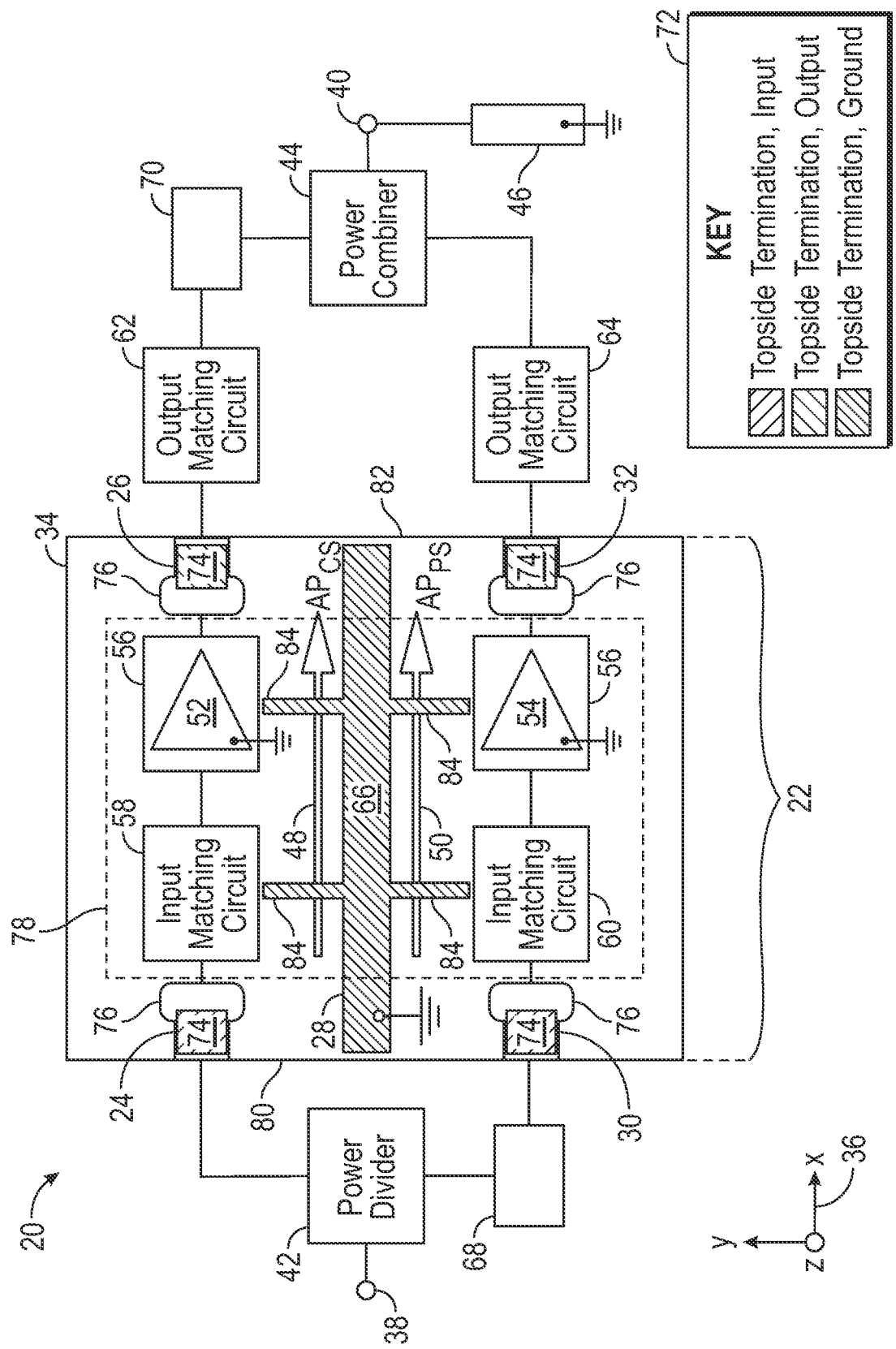
FIG. 1 schematically illustrates a multiple-path amplifier circuit (here, a two way Doherty amplifier circuit), portions of which may be implemented utilizing a leadless power amplifier (PA) package in accordance with example embodiments of the present disclosure.
Figure 2:
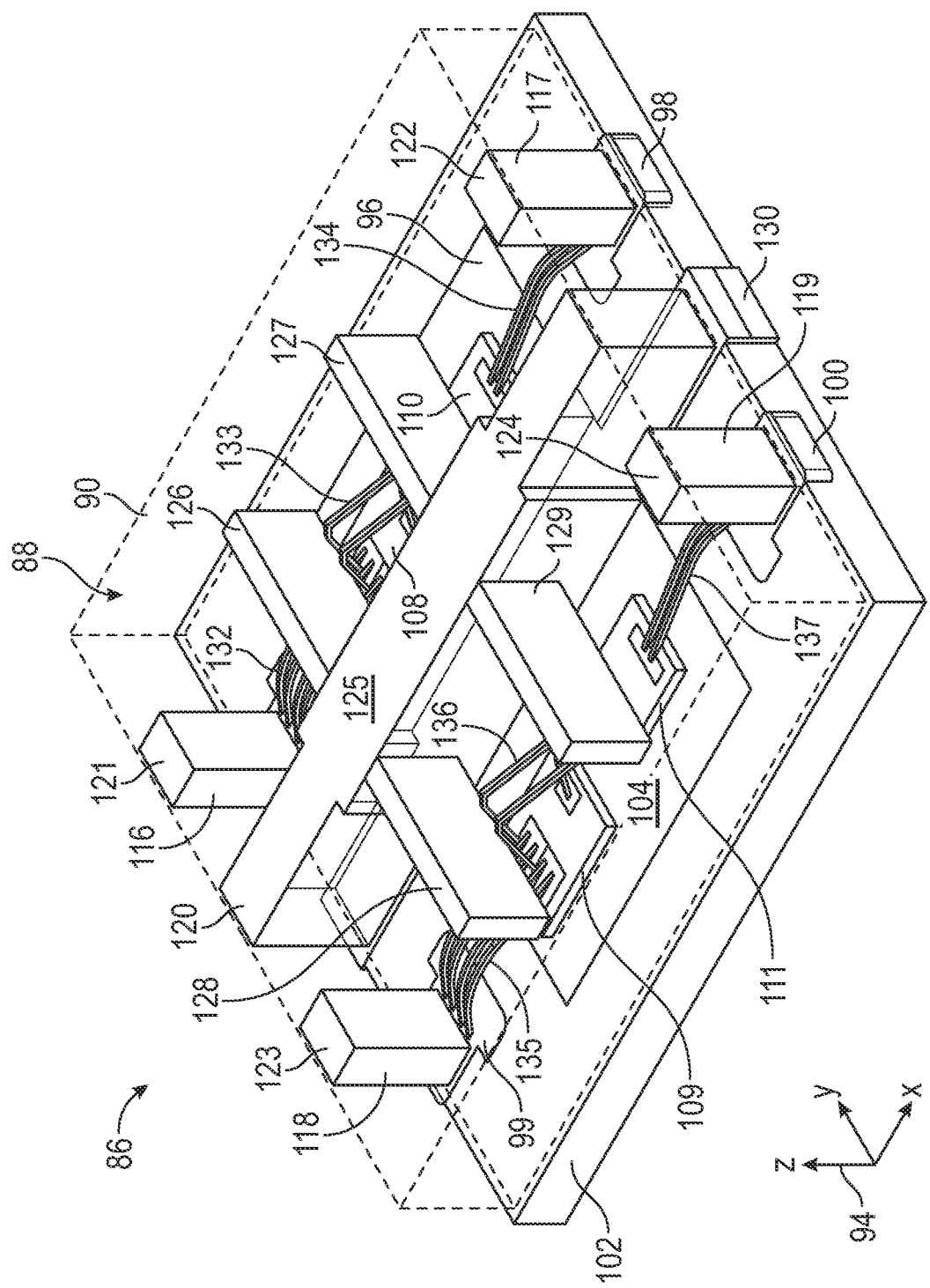
FIG. 2 is an isometric view of a leadless PA package including a topside input/output (I/O) interface, an overmolded package body (shown in phantom line), and a topside termination isolation structure, as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims. The term "integrated circuit die" or "IC die" encompasses integrated passive devices, metal-oxide-semiconductor capacitor devices, and other such circuit elements, which are formed on discrete, semiconductor material-containing die; as well as semiconductor material-containing dies containing more complex active integrated circuits, such as transistor amplifier circuits of the type described below.

Overview

The following describes power amplifier (PA) packages and methods for fabricating leadless PA packages including topside input/output (I/O) interfaces and other unique features, such as bottomside thermal interfaces. For a given embodiment of the leadless PA package, the topside I/O interface may include terminals substantially coplanar with, or perhaps slightly recessed or raised relative to, the package topside surface. As appearing herein, the term "package topside surface" refers to an outer principal surface of the PA package located opposite a base flange or similar die-supporting substrate contained within the PA package. The PA package further includes a package bottomside surface located opposite the package topside surface, as taken along the package centerline; that is, an axis extending orthogonal to a die mount surface of the base flange (corresponding to the below-described "package height direction"). Such terms of orientation are utilized in a relative sense, with terms such as "upper," "topside," "lower," and "bottomside" defined in view of respective proximity to the package base flange (or similar die-supporting substrate), noting that a given leadless PA package can function in any orientation in three dimensional space. In this latter regard, embodiments of the leadless PA package may be mounted in an inverted orientation when installed on an electrically-routed assembly-level substrate, such as a motherboard or other printed circuit board (PCB), included in a larger microelectronic system or assembly. Further, embodiments of the leadless PA package are conveniently fabricated as a flat no-lead package; that is, a leadless package having a substantially planar topside surface with which the terminals or contact pads of the topside I/O interface are generally coplanar or flush, again noting that the terminals or contact pads may be slightly recessed or raised relative to the topside surface; e.g., due to plating of the exposed contact surfaces following a planarization or back-grinding step. Examples of such flat no-lead packages include dual flat no-lead (DFN) packages or quad flat no-lead (QFN) packages. This stated, embodiments of the leadless PA package can possess various leadless form factors, providing the PA package includes a topside I/O interface and, perhaps, a bottomside thermal interface for extracting excess heat from the PA package, as further discussed below.

Embodiments of the leadless PA packages are beneficially fabricated to contain Doherty PA architectures and are principally described below as such. Embodiments of the leadless PA package can be fabricated to possess other PA architectures, however, providing the PA package contains at least one transistor-bearing, radio frequency (RF) power die utilized for power or signal amplification purposes. Further, in embodiments, the leadless PA package may contain additional circuitry in addition to a transistor integrated circuit (IC) or ICs, which serve as the amplifier section or sections of the PA package. Such additional circuitry can be realized utilizing discrete microelectronic components, such as surface mount devices (SMDs), further contained within the leadless PA package; and/or, perhaps, utilizing a small PCB (or similar electrically-routed substrate) further embedded in the PA package. More commonly, however, such additional circuitry (when contained in a given instance of the PA package) is formed on discrete IC dies, which are further contained in the leadless PA package and mounted to a supportive surface or "die mount surface" of a base flange; although, in certain cases, it is also possible for such additional circuitry to be formed on a common die with single state or multi-stage amplifier circuitry. Accordingly, in various implementations, additional IC dies may be contained in a given instance of the leadless PA package and carry or bear IC features, which provide any combination of input and/or output impedance matching, transistor biasing, harmonic termination, and other such functions. Generally, then, embodiments of the leadless PA package may be described as containing one or more IC dies, with at least one of the IC dies (and often at least two of the IC dies) assuming the form of an RF power die. In the case of a Doherty PA architecture, specifically, the packaged IC dies will often include at least one peaking RF power die and at least one carrier RF power die, which are positioned in parallel amplification paths in the form of peaking and carrier signal amplification paths extending in parallel within the leadless PA package.

To support formation of the topside I/O interface, a given PA package may include certain foundational structures or base elements onto which other components of the PA package are assembled during PA package fabrication. Such foundational structures can include, for example, a base flange and electrically-conductive pillar supports. The electrically-conductive pillar supports are spaced from the base flange in one or more directions taken in a die mount plane, which is coplanar with the die mount surface of the base flange. For manufacturing efficiency, the base flange and electrically-conductive pillar supports may be initially provided as a leadframe having sacrificial leadframe portions (e.g., including tie bars, spars, or the similar connective sections), which physically interconnect the base flange and electrically-conductive pillar supports during a majority of the manufacturing process stages. The sacrificial portion of the leadframe is subsequently removed during singulation to electrically isolate the base flange and electrically-conductive pillar supports (jointly referred to as a "base structure") following formation of the PA package body. Further, such a leadframe may be included in a larger a leadframe array, which contains a relatively large number of interconnected leadframes and which is globally processed to produce a number of leadless PA packages in parallel. While it is possible for instances of the leadless PA package to be fabricated as an air cavity package in embodiments, the leadless PA package will often be produced as an overmolded or encapsulated package containing an overmolded package body. In this latter case, the leadframe array may be encapsulated in an overmold panel following the performance of certain processing steps (described below), with the overmold panel and the leadframe array (jointly, the "overmolded leadframe array") then subject to a concurrent singulation process. Singulation of the overmolded leadframe array yields a plurality of PA packages, each containing an overmolded package body formed from a singulated piece of the overmold panel and singulated pieces of the leadframe (e.g., a base flange and pillar supports) embedded in the overmolded package body.

During an example PA package fabrication process, the base structure (the base flange and electrically-conductive pillar supports) is initially placed on the upper surface of a carrier, a work bench, or a similar temporary support surface. As noted above, the base structure is conveniently, although non-essentially, provided in a leadframe format. One or more IC dies, including at least one RF power die, are then attached to a die mount surface of the base flange. The IC dies and the pillar supports are electrically interconnected, as appropriate, by wirebonding or utilizing another interconnection approach. In embodiments, pillar contacts are physically attached and electrically coupled to the pillar supports, which the attachment of the pillar supports occurring at any suitable juncture prior to encapsulation or overmolding of the PA package (when practiced). The pillar contacts can assume the form of, for example, metallic pieces having rod-like or column-like form factors in embodiments; the term "metallic," as appearing herein, referring to a material predominately composed of one or more metals, by weight percentage. As a specific example, the pillar contacts may be copper (Cu) or other metallic blocks, rods, or similar forms in embodiments; the term "copper" referring to a metallic material predominately composed of Cu, by weight percentage. The pillar contacts may be joined to the pillar supports utilizing an electrically-conductive bonding material, such as an electrically-conductive die attach material, solder, or a sintered bonding material, examples of which are described below. In one approach, an electrically-conductive bond material (e.g., a metal particle-containing paste) is printed or otherwise applied to selected portions of the pillar supports or target mount locations on the pillar supports, the pillar contacts are placed in desired positions utilizing a pick-and-place tool, and curing is conducted to complete the electrical and mechanical bonding process. In still further embodiments, the pillar contacts may assume a different form suitable for providing vertical interconnections to the topside I/O terminals; e.g., the pillar contacts can be provided as electrically-conductive features or bodies formed in and through a surrounding dielectric body. For example, in this latter case, one or more pillar contacts can be provided utilizing a routed substrate (e.g., PCB) piece having metallic vias, coining, or similar electrically-conductive features providing the desired interconnections to the topside I/O terminals.

Regardless of the particular manner in which the pillar contacts are provided during the fabrication process, the pillar contacts are dimensioned and positioned to project from the pillar supports in the package height direction and toward the package topside surface. The package topside surface is defined subsequent to positioning of the pillar contacts by formation of the package body; that is, a material body, structure, or assembly enclosing the IC dies and other electrically-active components contained in the PA package. As noted above, embodiments of the leadless PA packages are readily fabricated as an overmolded or encapsulated package, which includes an overmolded package body in which the IC dies, the pillar supports, the pillar contacts, and the base flange are embedded. In embodiments in which a number of PA packages is fabricated in parallel, the overmolding process may be carried-out to create a relatively large overmold panel having an excessive thickness or overburden covering the upper terminal ends of the pillar contacts; that is, the ends of the pillar contacts located furthest from the base flange, as taken in the package height direction. Afterwards, the overmold panel may be thinned utilizing a suitable material removal process, such as back-grinding, to expose the terminal ends or surfaces of the pillar supports and at least partially define the topside package surface of the molded package body. Exposed through the topside package surface in this manner, the upper terminal surfaces of the pillar supports form topside I/O terminals included in the package topside I/O interface. In certain embodiments, electroplating may then be carried-out to deposit a plating finish on the topside I/O terminals, which may include the exposed surfaces of the pillar contacts and, in certain cases, exposed surfaces of a "topside termination isolation structure" further discussed below. When the leadless PA package is produced in parallel with a plurality of additional PA packages, an electroplating process may be carried-out by applying an electrical potential to the pillar supports and to the topside termination isolation structure through the leadframe array itself. In this manner, a desired plating layer or multi-layer plating system can be readily deposited onto the terminals of topside I/O interface without requiring additional processing steps, such as the deposition of solder balls, in at least some implementations of the present disclosure. Singulation is then carried-out to separate the leadframe array and the molded panel into a plurality of discrete leadless PA packages, each including a topside I/O interface.

Embodiments of the leadless PA package are fabricated to include a topside termination isolation structure; that is, an electrically-conductive structure, which provides shielding to reduce undesired electromagnetic (EM) coupling during PA package operation and which is electrically coupled to a (e.g., ground) terminal included in the topside I/O interface. When provided, the topside termination isolation structure may include at least one central partition or isolation wall, which extends between separate signal amplification paths within a given leadless PA package. The central isolation wall itself may be at least partly composed of an electrically-conductive (e.g., metallic) material and electrically coupled to ground during leadless PA package operation; the term "ground," as appearing herein, referring to electrical ground (or a similar reference voltage) applied to a terminal of the topside I/O interface during package operation. In one possible approach, the central isolation wall may include an upper terminal surface opposite the base flange, which is exposed along the package topside surface in a manner similar to that described above in connection with the pillar contacts; e.g., by back-grinding or otherwise thinning an overmolded package body (e.g., contained in a larger overmold panel) to reveal the upper terminal surface of the central isolation wall. The central isolation wall may be electrically coupled to the base flange by, for example, attaching the central isolation wall to the base flange utilizing an electrically-conductive (e.g., sintered) bonding material. The base flange may, in turn, be electrically coupled to ground terminals included in the packaged RF power dies; e.g., in the case of a Doherty amplifier architecture, peaking and carrier RF power dies may be electrically coupled to the base flange utilizing an electrically-conductive bonding material. Consequently, in such embodiments, electrical connection to the ground terminals (e.g., bond pads) of the carrier and peaking RF power dies is provided through the base flange, through the central isolation wall, and to a ground terminal included in the topside I/O interface, which may be at least partially defined by an upper surface of the central isolation wall accessible from the topside surface of the leadless PA package.

As noted above, peaking and carrier RF power dies may be positioned on opposing sides of a central isolation wall in embodiments in which the leadless PA package is imparted with a Doherty amplifier architecture or layout. Similarly, any additional packaged circuit elements or sections included in the peaking and carrier signal amplification paths may also be positioned on opposing sides of the central isolation structure when such additional circuit elements are contained in the PA package. For example, any number of impedance matching networks can be realized utilizing discrete IC dies, which may be deployed on opposing sides of the central isolation wall for reduced EM coupling between the amplifier signal paths to enhance RF performance characteristics of the PA package. Additionally or alternatively, the central isolation wall may be dimensioned to span a majority, if not the substantially entirety of the PA package body in a given direction, such as a lengthwise direction in which the central isolation wall is elongated. Accordingly, embodiments of the central isolation wall may include a first end portion, which terminates at or adjacent a first sidewall of the package body and which is positioned between a first pair of pillar contacts (e.g., two input pillar contacts spaced along a first edge of the PA package); an intermediate portion, which extends between and partitions IC dies located in different signal amplification paths (e.g., segregating peaking and carrier RF power dies in the case of a Doherty layout); and a second, opposing end portion, which terminates at or adjacent a second, opposing sidewall of the package body and which is positioned between a second pair of the pillar contacts (e.g., two output pillar contacts spaced along a second edge of the PA package). Additionally, the base flange can be produced to include extensions or "flange tie bars," which extend substantially parallel to and beneath the central isolation wall, as seen looking downwardly on the PA package in a package height direction. Further, the flange tie bars may extend to the opposing outer edges or sidewalls of the PA package body to allow interconnection of the base flange in a leadframe format or leadframe array, as previously described.

Additional electrical isolation can be provided by forming the topside termination isolation structure to further include one or more projections, fins, or cross-walls, which extend from the grounded isolation wall in lateral directions; that is, along axes substantially parallel to the die mount surface of the base flange and substantially perpendicular to the axis along which the central isolation wall is elongated. For example, the topside termination isolation structure may include one or more lateral isolation wings, which project from the central isolation wall and into separate (e.g., carrier and peaking) signal amplification paths, as viewed looking downwardly onto the die mount surface of the base flange. Such lateral isolation wings may be suspended or raised above the die mount surface of the base flange by vertical isolation gaps, which may be filled with encapsulant or overmold material in embodiments in which the PA package is fabricated to have an overmolded package body. Further, in certain cases, the lateral isolation wings may extend over one or more RF power dies (e.g., the carrier and peaking RF power dies) contained within the PA package and have lower edges (again, the term "lower" defined relative to the proximity to the base flange) positioned in a close proximity, non-contacting relationship with the adjacent surfaces of the RF power dies. Due to such positioning, enhanced isolation between the input and output terminals or sides of the RF power dies can be achieved, particularly as the lateral isolation wings may each be at least partially composed of an electrically-conductive material electrically coupled to the ground terminal of the PA package through the central isolation wall. The lateral isolation wings and the central isolation wall may be provided as a single piece or unitary structure in embodiments; while, in other embodiments, this may not be the case. The lateral isolation wings may further possess heights sufficient to exceed the peak wirebond heights when wirebonding is utilized to interconnect the RF power dies for enhanced isolation benefits. Additional lateral isolation wings may likewise be provided to extend over the other IC dies potentially included in the PA package and provide additional die-specific I/O wirebond isolation in embodiments, such as when the PA package further contains one or more discrete IC dies bearings input-side and/or output-side impedance matching networks.

In the above-described manner, PA packages can be fabricated to have compact, leadless form factors and enhanced isolation capabilities utilizing a cost effective, streamlined, reliable manufacture process. As a still further benefit, embodiments of the PA packages may provide enhanced thermal performance through the inclusion of unique bottomside thermal interfaces. As appearing herein, the term "bottomside thermal interface" refers to an externally-accessible interface exposed along the bottomside surface of the leadless PA package through which excess heat can be ready extracted from the body of the leadless PA package and, specifically, from locations adjacent one or more RF power die (and possibly other heat-generating components) within the PA package. The bottomside thermal interface may be, for example, a lower principal surface of a metallic base flange or other substrate (e.g., a small PCB with coining or a coreless substrate), which is exposed at and may be substantially coplanar with the bottomside of the PA package. When the PA package is installed within a larger electronic assembly or system, the bottomside thermal interface may be left exposed (uncovered) to allow convective heat transfer to the ambient environment More usefully, however, the bottomside thermal interface may be thermally coupled to an assembly-level heatsink when the PA package is installed within a larger electronic assembly to further promote excess heat outflow from the PA package and dissipation of the excess heat to the ambient environment. Such an assembly-level heatsink can be, for example, a fin array, a metal chassis, or another thermally-conductive structure suitable for absorbing excess heat extracted from the PA package and convectively transferring or releasing excess heat to the surrounding environment Electrical connections are further formed between the topside I/O interface of the PA package and an assembly-level substrate, such as a motherboard, to which the PA package is mounted in an inverted orientation when the PA package is installed within a larger electronic assembly or system. Thus, in a general sense, heat may be conductively extracted from the PA package in a first general direction (through the bottomside thermal interface), while electrical signals are exchanged with the PA package in a second, opposing direction through the topside I/O interface.

Considering the enhanced thermal performance and isolation capabilities provided by embodiments of the present disclosure, the presently-disclosed leadless PA packages are well-suited for usage in applications benefiting from improved reliability, minimized system costs, reductions in radio volume, and greater thermal dissipation, such as massive multiple input/multiple output (mMIMO systems). The PA packages are also well-suited for usage in conjunction with high power density die technologies often prone to excess heat generation, particularly when utilized to fabricate the carrier RF power die in the case of a Doherty PA architecture. Examples of such high performance dies include layered base die structures, such as layered Gallium Nitride (GaN) structures and layered Gallium Arsenide (GaAs) structures; and IC dies fabricated utilizing certain high electrical resistance substrates, such as high resistance bulk silicon (Si) substrates, silicon-on-insulator (SOI) substrates, and diamond-based and glass-based substrates. A first example leadless PA package having a topside I/O interface and other unique features (e.g., a topside termination isolation structure) will now be described in conjunction with FIGS. 1-8, while example methods for fabricating such a PA package in conjunction with a plurality of similar or identical PA packages is further discussed below in connection with FIGS. 9-12. One manner in which the leadless PA package shown in FIGS. 2-8 may be installed within a larger electronic assembly or system in an inverted orientation is discussed below in connection with FIG. 13. Finally, a second example embodiment of a leadless PA package having a topside I/O interface and a topside termination isolation structure is set-forth below in connection with FIG. 14.

General Discussion of Leadless Power Amplifier Packages Including Topside Terminations FIG. 1 is a schematic diagram of a Doherty PA circuit 20, as illustrated in accordance with an example embodiment of the present disclosure. One or more portions of Doherty PA circuit 20 may be provided in the form of a PA package, such as PA package 22 generically outlined in FIG. 1. Leadless PA package 22 may be produced to include a leadless topside I/O interface 24, 26, 28, 30, 32, with surfaces of the various terminals or contacts included in topside I/O interface 24, 26, 28, 30, 32 exposed at a topside package surface of PA package body 34 of PA package 22; e.g., an outer principal surface of PA package body 34, which may (but need not necessarily) having a substantially planar or "flat" topology generally extending in the X-Y plane of coordinate legend 36. In the present example, specifically, leadless PA package 22 is realized as a DFN package having a first set of input terminals 24, 30; a second set of output terminals 26, 32; and at least one ground terminal 28. In further embodiments, leadless PA package 22 can be fabricated to have other topside I/O interface layouts and assume various other form factors depending on, for example, the number and type of microelectronic components (principally, IC die) contained within PA package body 34, the package component layout and interconnection scheme employed, and other design factors. Additional description of example realizations of PA package 22 is set-forth below. First, however, Doherty PA circuit 20 is described in greater detail to provide an illustrative, non-limiting context in which embodiments of PA package 22 may be better understood.

In the illustrated example, Doherty PA circuit 20 includes an input node 38, an output node 40, and a power divider 42 (or splitter) between nodes 38, 40. Doherty PA circuit 20 further includes a carrier (main) signal amplification path and at least one peaking (auxiliary) signal amplification. Power divider 42 is configured to divide the power of an input RF signal received at input node 38 into a carrier portion and a peaking portion, which are directed along the carrier and peaking signal amplification paths, respectively. The carrier and peaking signal amplification paths extend in parallel until subsequent recombination at a power combiner 44, which is electrically coupled to circuit output node 40. As identified by a first arrow 48 labeled "$AP_{CS}$" in FIG. 1, a portion of the carrier signal amplification path extends through leadless PA package 22. Similarly, as identified by a second arrow 50 labeled "$AP_{PS}$," a portion of the peaking signal amplification path likewise extends through PA package 22 in parallel with the carrier signal amplification path (arrow 48). During operation of the larger assembly or system in which Doherty PA circuit 20 is installed, an electrical load 46 is coupled to circuit output node 40 directly or through any number of additional circuit elements (e.g., a non-illustrated impedance transformer). Doherty PA circuit 20 is well-suited for incorporation in a larger, non-illustrated PA system, such as a cellular base station or other wireless communication system, with load 46 receiving an amplified RF signal from Doherty PA circuit 20 for subsequent over-the-air radiation via an antenna array.

Leadless PA package 22 contains a carrier amplifier 52 positioned in the carrier signal amplification path 48 and a peaking amplifier 54 positioned in the peaking signal amplification path 50. Amplifiers 52, 54 each include at least one power transistor IC for amplifying RF signals conducted through amplifiers 52, 54. The power transistor ICs may be fabricated on semiconductor dies 56, 57 and imparted with a single-stage or multi-stage configuration. In embodiments, all amplifier stages (or a final amplifier stage) of either or both of amplifiers 52, 54 may be implemented utilizing any of the following transistor technologies: a silicon-based field effect transistor (e.g., a laterally-diffused metal oxide semiconductor FET or LDMOS FET) or a III-V FET (e.g., a gallium nitride (GaN) FET, a gallium arsenide (GaAs) FET, a gallium phosphide (GaP) FET, an indium phosphide (InP) FET, or an indium antimonide (InSb) FET, or another type of III-V transistor). The carrier and peaking transistor ICs may be equally sized when, for example, Doherty PA circuit 20 has a symmetric configuration. Alternatively, the carrier and peaking transistor ICs may have unequal sizes in the case of various asymmetric Doherty configurations; it being understood that the term "size," as appearing in this context, is utilized in reference to the active periphery or total active gate width of the power transistor ICs. In an asymmetric Doherty configuration, specifically, the peaking transistor IC(s) may be larger than the carrier transistor IC(s) by some multiplier. For example, the peaking transistor IC(s) may be twice the size of the carrier transistor IC(s) such that the peaking transistor IC(s) have approximately twice the current carrying capability of the carrier transistor IC(s). Peaking-to-carrier amplifier IC size ratios other than a 2:1 ratio may be implemented, as well. For convenience of explanation, and to reflect the fact that FETs are predominately utilized in the production of PA devices, the foregoing paragraph and this document, as a whole, principally focus on implementations of the (e.g., Doherty) PA devices implemented utilizing FETs. In alternative embodiments of the present disclosure can be implemented utilizing other transistor types, however, including bipolar transistors. Generally, then, embodiments of the present disclosure are not restricted to usage in conjunction with any particular transistor type or die technology.

Carrier amplifier 52 of Doherty PA circuit 20 may be biased to function in class AB mode during circuit operation, while peaking amplifier 54 is biased to function in class C mode. At low power levels (e.g., when the power of the input signal applied to input node 38 is less than the turn-on threshold level of peaking amplifier 54), Doherty PA circuit 20 operates in a low-power or back-off mode. In the low-power (back-off) mode, carrier amplifier 52 may be only amplifier supplying current to load 46. When the power of the input signal exceeds a threshold level of peaking amplifier 54, however, Doherty PA circuit 20 transitions to operation in a full-power or high-power mode in which carrier amplifier 52 and peaking amplifier 54 supply current to load 46 concurrently. At this point, peaking amplifier 54 provides active load modulation at power combiner 44, allowing a continued, substantially linear increases in the current output of carrier amplifier 52. Also, as Doherty PA circuits 20 operates in the full-power mode during which amplifiers 52, 54 concurrently supply current to load 46, power divider 42 apportions the input signal power between the signal amplification paths accordingly. When Doherty PA circuit 20 is imparted with a symmetric Doherty PA configuration, power divider 42 may apportion power in a substantially equivalent manner, such that approximately one half of the input signal power is provided to each signal amplification path (arrows 48, 50). In other instances, such as when Doherty PA circuit 20 is imparted with an asymmetric Doherty PA configuration, power divider 42 may be configured to apportion power unequally between the signal amplification paths (arrows 48, 50). Essentially, then, power divider 42 divides an input RF signal supplied at input node 38, with the divided signal portions then separately amplified along the carrier or "main" signal amplification path (arrow 48) and the peaking or "auxiliary" signal amplification path (arrow 50).

In the illustrated example, Doherty PA circuit 20 further includes two input impedance matching circuits or networks 58, 60 and two output impedance matching circuits or networks 62, 64. Matching networks 58, 60, 62, 64 may serve to incrementally increase the circuit impedance toward the load impedance or the source impedance, as appropriate. In certain implementations, matching networks 58, 60, 62, 64 may each be implemented inside PA package 22, in whole or in part. For example, as indicated in FIG. 1, and in the corresponding examples described below in connection with FIGS. 2-14, input matching networks 58, 60 may be contained in PA package 22; e.g., input impedance matching network 58 may implemented on a discrete IC die contained in PA package 22 and positioned on a first side (the "carrier side") of a central isolation wall 66 (described below), while input impedance matching network 60 is likewise implemented on a discrete IC die further contained in PA package 22 and positioned on a second, opposing side (the "peaking side") of central isolation wall 66. Comparatively, in such implementations, output impedance matching networks 62, 64 may be implemented on a printed circuit board (PCB) or another assembly-level substrate to which PA package 22 is mounted, with networks 62, 64 implemented utilizing any combination of IC dies, surface mount devices (SMDs), or circuit elements formed in the assembly-level PCB itself. In other instances, all, none, or a different subset of matching networks 58, 60, 62, 64 may be integrated into PA package 22. A large degree of design flexibility is thus afforded in implementing PA package 22 and Doherty PA circuit 20, generally. Further, either or both of power amplifiers 52, 54 may be implemented with multiple parallel amplification paths (rather than with a single amplification path) in more complex embodiments. For example, in an example asymmetric Doherty configuration, carrier amplifier 52 may be implemented with two (or a greater number of) parallel amplification paths, while peaking amplifier 54 is implemented with three (or some other number of) parallel amplification paths. Further, in the case of an N-way Doherty amplifier (N>2), PA package 22 may contain multiple peaking amplifiers of differing configurations or levels.

In the relatively simple example of FIG. 1, Doherty PA circuit 20 has a standard load network configuration. Accordingly, the input-side circuit portion is configured such that an input signal supplied to peaking amplifier 54 is delayed by 90 degrees with respect to the input signal supplied to carrier amplifier 52 at the center frequency of operation of, for example, Doherty PA circuit 20. To ensure arrival of the carrier and peaking input RF signals at amplifiers 52, 54 with approximately 90 degrees of phase shift, a first phase delay element 68 may be incorporated into Doherty PA circuit 20 to provide about 90 degrees of phase delay to the peaking input signal. For example, phase delay element 68 may include a quarter wave transmission line, or another suitable type of delay element, with an electrical length of about 90 degrees. To compensate for the resulting 90 degree phase delay difference between the carrier and peaking amplification paths (arrows 48, 50) at the inputs of amplifiers 52, 54, and thereby ensure that the amplified signals arrive in phase at power combiner 44, the output-side circuit portion is similarly configured to apply about a 90 degree phase delay to the signal between the output of carrier amplifier 52 and power combiner 44. This may be achieved through the provision of an additional phase delay element 70. While Doherty PA circuit 20 has a standard load network configuration in the illustrated embodiment, other load network configurations are possible in other implementations. For example, in alternative implementations, Doherty PA circuit 20 may instead have an alternate (or "inverted") load network configuration. In this case, the input-side circuit portion may be configured such that an input signal supplied to carrier amplifier 52 is delayed by about 90 degrees with respect to the input signal supplied to peaking amplifier 54 at the center frequency of operation of Doherty PA circuit 20. Correspondingly, the output-side circuit portion may be configured to apply about a 90 degree phase delay to the signal between the output of peaking amplifier 52 and power combiner 44.

Leadless PA package 22 is fabricated to include a topside I/O interface 24, 26, 28, 30, 32. Further, as indicated by a key 72 appearing in the lower right of FIG. 1, topside I/O interface 24, 26, 28, 30, 32 may include the following "terminations" or terminals: (i) input terminals 24, 30; (ii) output terminals 26, 32; and (iii) at least one central ground terminal 28. The terminals of topside I/O interface 24, 26, 28, 30, 32 are accessible from the package topside surface of leadless PA package 22 facilitating installation of PA package 22 in a larger electronic system or assembly utilizing various surface mount approaches, as further discussed below in connection with FIG. 13. As discussed in detail below, terminals 24, 26, 30, 32 can be formed by exposed terminal end surfaces of a number of elongated pillar contacts 74, which extend from electrically-conductive pillar supports 76 in the package height direction (corresponding to the Z-axis of coordinate legend 36). Pillar contacts 74 and pillar supports 76 are composed of an electrically-conductive material; and, in certain embodiments, some or all of pillar contacts 74 may be integrally formed with their associated electrically-conductive pillar supports 76 as a single or unitary (e.g., metallic) piece. More commonly, however, pillars contacts 74 are realized utilizing elongated metallic blocks, rods, or similar electrically-conductive structures, which are mounted to pillar supports 76 utilizing an electrically-conductive bonding material and, in certain cases, a sintered bonding material. Electrically-conductive paths are consequently created extending from the upper terminal surfaces of pillar supports 76 defining topside terminals 24, 26, 30, 32 to the associated pillar supports 76. The pillar supports 76 are, in turn, electrically coupled to the appropriate terminals (e.g., bond pads) of IC dies contained in leadless PA package 22. Electrical interconnections are likewise formed between input matching networks 58, 60 and RF power dies 56, whether by wirebonding or utilizing another interconnection technique; e.g., three dimensional printing techniques for creating conformal traces utilizing electrically-conductive inks. Additional description of pillar contacts 74 and pillar supports 76 is provided below in connection with FIGS. 2-8.

With continued reference to FIG. 1 leadless PA package 22 further contains a topside termination isolation structure 66, 84. While capable of assuming a wide range of forms, topside termination isolation structure 66, 84 includes the above-mentioned central isolation wall 66, as well a number of lateral isolation wings 84, in the illustrated example. Further, in the schematic of FIG. 1, the dimensioning and positioning of central isolation wall 66 and lateral isolation wings 84 is drawn in a general conceptual sense, with a more realistic example of intra-package isolation structure 66, 84 discussed below in connection with FIGS. 2-8. Addressing first central isolation wall 66, this feature of PA package 22 may assume the form of an electrically-conductive (e.g., metallic) fin-like body or piece part, which extends from a location at or adjacent the topside surface of PA package 22 in the package height direction (again, corresponding to the Z-axis of coordinate legend 36) toward a die attach surface of the above-mentioned base flange 78 further contained in PA package 22. In embodiments, central isolation wall 66 may be physically attached and electrically coupled to base flange 78 at the wall-flange interface by, for example, bonding with a sintered bonding material or another electrically-conductive bonding material. The upper terminal surface or ridge of central isolation wall 66 (that is, the surface of central isolation wall 66 located furthest from the die mount surface of base flange 78) may be exposed along the topside surface of PA package 22 to define a topside ground terminal, potentially along with similar exposure of the upper terminal surfaces or ridges of lateral isolation wings 84, as indicated by the cross-hatching pattern identified in key 72. As discussed further below, these exposed surfaces may be electroplated or left bare; noting that the surfaces of central isolation wall 66, lateral isolation wings 84 (if exposed), and pillar contacts 74 are considered exposed at or along (and therefore accessible from) the package topside surface when plated or otherwise coated with one or more layers of an electrically-conductive material.

By virtue of the above-described structural arrangement, central isolation wall 66 provides a relatively voluminous electrical path between the ground terminal of topside I/O interface 24, 26, 28, 30, 32 and base flange 78, which may be embedded in a lower portion of package body 34. Further, given the relatively expensive surface area of topside termination isolation structure 66, 84, as measured in the X-Y plane of coordinate legend 36, a relatively large surface area is availed for bonding and electrical conduction when PA package 22 is installed within a larger electronic system or assembly. RF power dies 56 may further include ground terminals or bond pads, which are electrically coupled to base flange 78; e.g., by attaching RF power dies 56 to die mount surface of base flange 78 utilizing electrically-conductive bonding materials, such as sintered metallic (e.g., silver-containing (Ag-containing) bonding layers). Robust electrical grounding paths are consequently formed extending from topside ground terminal 28 of PA package 22 (again, defined by the upper exposed, plated or non-plated surface of topside termination isolation structure 66, 84), through the body of central isolation wall 66, through base flange 78, and to the respective ground terminals of RF power dies 56 and the transistor IC circuits (the peaking and carrier amplifiers) integrated into RF power dies 56. Further, as can be seen in FIG. 1, the carrier RF power die 56 bearing carrier transistor IC 52 and the peaking RF power die 56 bearing peaking amplifier IC 54 are positioned on opposing sides of central isolation wall 66. As a grounded, electrically-conductive structure, central isolation wall 66 provides EM shielding between RF power dies 56 to reduce or eliminate undesired EM coupling between carrier transistor IC 52 and peaking amplifier IC 54. Further, as indicated in FIG. 1, central isolation wall 66 may extend from a location adjacent a first package sidewall 80 to a location adjacent a second, opposing package sidewall 82 of PA package 22. Central isolation wall 66 may thus span the substantial entirety of the lengths of signal amplification paths 48, 50; and, perhaps, a majority, if not the substantial entirety of the length of PA package 22, as measured along the X-axis of coordinated legend 36.

Central isolation wall 66 may thus be described as having a first end portion extending between the first pair of the pillar contacts (corresponding to topside terminals 24, 30); a second end portion extending between the second pair of the pillar contacts (corresponding to topside terminals 26, 32); and an intermediate portion located between the first end portion and the second end portion, with the RF power die 56 bearing carrier amplifier 52 and the RF power die 56 bearing the peaking amplifier 54 located on opposing sides of the intermediate portion of the central isolation wall. Central isolation wall 66 thus provides comprehensive or thorough EM shielding along the package length direction (corresponding to the X-axis of coordinate legend 36). Further, in the package height direction (corresponding to the Z-axis of coordinate legend 36), central isolation wall 66 may extends away from the die mount surface of base flange 78 and fully to the topside surface of PA package 22 in embodiments. Consequently, in such embodiments, central isolation wall 66 further provides EM isolation between topside terminals 24, 30 (and the corresponding pillar contacts 74) located adjacent package sidewall 80, which are separated by the first intervening end portion of wall 66 as taken in a package width direction (corresponding to the Y-axis of coordinate legend 36). Similarly, central isolation wall 66 further provides EM isolation between topside terminals 26, 32 (and the corresponding pillar contacts 74) separated by the second end portion of wall 66, as taken in the package width direction. Consequently, central isolation wall 66 provides EM shielding or isolation between the carrier signal amplification path (arrow 48) and the peaking signal amplification path (arrow 50) along the respective entireties or substantial entireties of these paths.

As indicated above, embodiments of PA package 22 may be fabricated to include one or more isolation fins, crosswalls, or wings 84, which extend from central isolation wall 66 in lateral directions (corresponding to the "package width direction" and parallel to the Y-axis of coordinate legend 36). When provided, lateral isolation wings 84 may be suspended above the die mount surface of base flange 78 by a set vertical spacing or isolation gaps. Although not shown in FIG. 1 for clarity, IC dies bearing input matching networks 58, 60 and/or RF power dies 56 bearing amplifier ICs 52, 54 may be positioned beneath lateral isolation wings 84 such that each isolation wing 84 extends in close, but non-contacting proximity to a mid-portion or central section of each die. Concurrently, isolation wings 84 may be imparted with heights, as measured in the package height direction (corresponding to the Y-axis of coordinate legend 36), sufficient to extend to an upper termination point adjacent, and perhaps, substantially coplanar with the upper terminal surface of central isolation wall 66. Further, in embodiments in which the various electrical interconnections between the IC die are formed by wirebonding, the upper terminal surfaces of lateral isolation wings 84 (again, the surfaces of isolation wings 84 located furthest base flange 78, as taken in a package height direction) may be located closer to (and, indeed, may be substantially coplanar with) the package topside surface than are wirebonds taken at the peak wirebond height. Considering this positioning, and further considering that lateral isolation wings 84 are electrically coupled (and possibly integrally formed with) grounded central isolation wall 66, each isolation wing 84 may provide additional electrical isolation or shielding between the input-side and output-side terminals (bond pads) of the dies carrying circuitry 52, 54, 58, 60, as well as the wirebonds electrically coupled thereto. These advantages notwithstanding, lateral isolation wings 84 and, perhaps, central isolation wall 66 may be omitted from PA package 22 in alternative embodiments.

Turning now to FIGS. 2-8, an example implementation of a leadless PA package 22 (FIG. 1) is shown from a range of viewpoints and is referred to hereafter as "leadless PA package 86." In this particular example, leadless PA package 86 is fabricated as an overmolded or encapsulated package including an overmolded package body 88 having package topside surface 90 and a package bottomside surface 92 (FIG. 4), which are opposed in a package height direction (corresponding to the Z-axis of coordinate legend 94). Overmolded package body 88 is formed over and around various internal structures or components of leadless PA package 22 including a base flange 96 and a plurality of pillar supports 97-100 (generally corresponding to base flange 78 and pillar supports 76 shown in FIG. 1, respectively). Overmolded package body 88 is at least partially drawn in phantom line or hidden from view in FIGS. 2-8 to more clearly illustrated the interior of leadless PA package 22; however, a lower dielectric body portion 102 is further shown in which base flange 96 and pillar supports 97-100 are embedded. As described more fully below in connection with FIGS. 9-12, lower dielectric body portion 102 may be integrally formed with the remainder of overmolded package body 88 as a single overmolded body. In alternative embodiments, lower dielectric body portion 102 can be formed via an initial overmolding process, with the remainder of overmolded package body 88 subsequently formed utilizing a second overmolding process. As a still further possibility, lower dielectric body portion 102 may not be overmolded, but rather composed of a ceramic, a PCB resin, or another dielectric material; in which case, lower dielectric body 102, base flange 96 and pillar supports 97-100 may be initially produced as a pre-fabricated structure; e.g., in this case, the pre-fabricated substrate may be purchased or otherwise obtained from a supplier as an individual unit or in an interconnected panel form.

Base flange 96 includes an upper surface 104 (referred to herein as "die mount surface 104") and an opposing lower flange surface 106. Multiple IC dies 108-111 are attach to different locations distributed across die mount surface 104 of base flange 96, which may extend substantially parallel to package topside surface 90 in at least some embodiments of leadless PA package 86. In the illustrated example in which leadless PA package 86 is imparted with a Doherty amplifier architecture and generally corresponds to leadless PA package 22 described above in connection with FIG. 1, four IC dies 108-111 are contained with PA package 86: (i) a first IC die 108 bearing a carrier-side input matching network (herein, "$MN_{CS}$ die 108"); (ii) a second IC die 109 bearing a peaking-side input matching network (herein, "$MN_{PS}$ die 109"); (iii) a third IC die 110 bearing a carrier amplifier IC (herein, "carrier RF power die 110"); and (iv) a fourth IC die 111 bearing a peaking amplifier IC (herein, "peaking RF power die 111"). $MN_{CS}$ die 108 and carrier RF power die 110 are positioned in a carrier signal amplification path, which extends through leadless PA package 86 and which is represented by a first arrow 112 shown in an upper portion of FIG. 3. Conversely, $MN_{PS}$ die 109 and peaking RF power die 111 are positioned in a carrier signal amplification path, which likewise extends through PA package 86 and which is represented by a second arrow 112 shown in a lower portion of FIG. 3.

A number of pillar contacts 116-119 and a central isolation wall 120 are further embedded in overmolded package body 88. As discussed below, upper terminal surfaces of pillar contacts 116-119 and a central isolation wall 120 may be exposed along package topside surface 90 to define a topside I/O interface 121, 122, 123, 124, 125. In the illustrated example, specifically, an upper terminal surface of pillar contact 116 defines a topside carrier input terminal 121, an upper terminal surface of pillar contact 117 defines a topside carrier output terminal 122, an upper terminal surface of pillar contact 118 defines a topside peaking input terminal 123, an upper terminal surface of pillar contact 119 defines a topside peaking output terminal 124, and an upper terminal surface of central isolation wall 120 defines a topside ground terminal 125. Topside ground terminal 125, in particular, may be further defined by exposed upper surfaces or ridges of a number of cross-wall structures or "lateral isolation wings" 126-129, which extend from central isolation wall 120; although this may not be the case in alternative embodiments in which lateral isolation wings 126-129 terminate in a height-wise direction before breaching package topside surface 90 (or when lateral isolation wings 126-129 are entirely omitted from leadless PA package 86). The upper terminal surfaces of pillar contacts 116-119 and central isolation wall 120 defining topside terminals 121, 122, 123, 124, 125 may be plated or otherwise coated with at least one layer of an electrically-conductive material in embodiments. In other embodiments, the upper terminal surfaces of pillar contacts 116-119 and central isolation wall 120 defining topside terminals 121, 122, 123, 124, 125 may be left bare or unplated. In either instance, upper terminal surfaces of pillar contacts 116-119 and central isolation wall 120 defining topside terminals 121, 122, 123, 124, 125 are considered exposed when accessible from package topside surface 90 for electrical connection with a corresponding electrical interface provided on a motherboard or other assembly-level substrate, as discussed more fully below in connection with FIG. 13.

Pillar contacts 116-119 are each attached to and project upwardly from pillar supports 97-100 in a package height direction. Pillar contacts 116-119 may each be elongated in a package height direction and imparted with a sufficient height to extend from pillar supports 97-100 to package topside surface 90. In embodiments, the heights of pillar contacts 116-119 (identified by a first arrow 140 in FIGS. 5 and 6) may exceed and, perhaps, may be at least twice the height or thickness of base flange 96, as measured in the package height direction and as indicated by a second arrow 142 in FIGS. 5 and 6). The height of central isolation wall 120 (when provided) may likewise exceed the height or thickness of base flange 96 and may be substantially equivalent to the respective heights of pillar contacts 116-119 in the illustrated example. Central isolation wall 120 is further elongated along its length and may extend a majority, if not the substantial entirety of the length of leadless PA package 86, as measured in the package length direction (corresponding to the X-axis of coordinate legend 94). Accordingly, central isolation wall 120 may extend from a first location adjacent a first sidewall of overmolded package body 88; between pillar contacts 116, 117; across a widened portion of base flange 96; between pillar contacts 118, 119; and to a second opposing sidewall of overmolded package body 88. Stated differently, central isolation wall 120 includes a first end portion positioned between the pair of pillar contacts 116, 117; an intermediate portion positioned between $MN_{CS}$ die 108 and $MN_{CS}$ die 109, as well as between carrier RF power die 110 and peaking RF power die 111; and a second end portion positioned between the pair of pillar contacts 118, 119.

Central isolation wall 120 is bonded to die mount surface 104 of base flange 96; and, in embodiments, central isolation wall 120 may be electrically coupled to base flange 96 utilizing an electrically-conductive bonding material, such as a sintered bonding material. As shown most clearly in FIG. 4, base flange 96 is produced to include a main body from which two extensions or "flange tie bars" 130 extend in opposing directions. Flange tie bars 130 are located beneath central isolation wall 120 (as viewed looking downwardly onto die mount surface 104 of base flange 96), extend substantially parallel to central isolation wall 120, and may extend fully to (and thus breach) the opposing package sidewalls adjacent pillar contacts 116-119. When present, flange tie bars 130 provide at least two benefits. First, flange tie bars 130 provide increased surface area for (e.g., metallurgical) bonding with central isolation wall 120 along the entire or substantially entire length of isolation wall 120 to provide a high strength, low electrical resistance joint at this interface. Second, flange die bars 130 facilitate the provision of base flange 96 as a leadframe, which further includes pillar supports 97-100. An example of such a leadframe is discussed below in connection with FIG. 9.

Various sets of wirebonds 132-138 are utilized to electrically conductive pillar supports 96-100 and IC dies 108-111. For example, and referring initially to the carrier signal amplification side of leadless PA package 86, a first set of wirebonds 132 electrically couples pillar support 94 to an input pad of $MN_{CS}$ die 108; a second set of wirebonds 133 electrically couples input and output pads of $MN_{CS}$ die 108 to an input pad of carrier RF power die 110; and a third set of wirebonds 134 electrically couples the output pad of carrier RF power die 110 to pillar support 94. Similarly, referring to the peaking signal amplification side of leadless PA package 86, a fourth set of wirebonds 135 electrically couples pillar support 96 to an input pad of $MN_{PS}$ die 109; a fourth set of wirebonds 136 electrically couples input and output pads of $MN_{PS}$ die 109 to an input pad of peaking RF power die 111; and a sixth set of wirebonds 137 electrically couples the output pad of peaking RF power die 111 to pillar support 100. In this manner, an electrically-conductive carrier signal amplification path (arrow 112, FIG. 3) is formed extending from topside terminal 121, through pillar contact 116, through pillar support 97, and ultimately to carrier RF power die 110; and, from carrier RF power die 110, through pillar support 98, through pillar contact 117, and to topside terminal 122. In a similar regard, an electrically-conductive peaking signal amplification path (arrow 114, FIG. 3) is formed extending from topside terminal 123, through pillar contact 118, through pillar support 99, and ultimately to peaking RF power die 111; and, from peaking RF power die 111, through pillar support 100, through pillar contact 119, and to topside terminal 124. Given the positioning and dimensioning of central isolation wall 120 in the package length (X-axis) and package height (Z-axis) directions, central isolation wall 120 provides in-package EM shielding between the across the substantial entirety of signal amplification paths to optimize RF performance. Relative to wirebonds 132-138, central isolation wall 120 is imparted with sufficient heat to exceed the peak wire bond height taken along the entirety of the carrier and peaking signal amplification paths. Isolation is thus provided between the carrier and peaking sections of Doherty PA package 86, while enabling topside termination grounding of RF power dies 110, 111 through central isolation wall 120.

As indicated above, embodiments of leadless PA package 22 may be fabricated to include one or more lateral isolation wings 126-129, which extend from central isolation wall 120 in lateral directions (corresponding to the "package width direction" and parallel to the Y-axis of coordinate legend 94). When provided, lateral isolation wings 126-129 may be suspended above the die mount surface of base flange 78 by a set vertical spacing or isolation gaps, as shown most clearly in FIGS. 5-8. Lateral isolation wings 126-129 are positioned to extend over IC dies 108-111, as viewed looking downwardly onto die mount surface 104 of base flange 96, while being suspended above IC dies 108-111 in a non-contacting relationship. As shown most clearly in FIGS. 7 and 8, lateral isolation wings 126-129 may each extend between the input and output pads of a given IC dies 108-111 to provide EM isolation between the particular wirebonds 132-138 joined to the input and output pads of that IC die. Sufficient spacing is provided to accommodate the arch-shaped paths followed by wirebonds 132-138 without contact between wirebonds 132-138 and lateral isolation wings 126-129, again noting that the depicted structures are embedded in overmolded package body 88 (hidden from view in FIGS. 7 and 8). With respect to wirebonds 136 electrically coupling $MN_{PS}$ die 109 to peaking RF power die 111 (FIG. 7), specifically, one or more of wirebonds 136 may extend upwardly from dies 109, 110 in a direction opposite base flange 96 and into a region of space between lateral isolation wings 128, 129. In an analogous manner, one or more of wirebonds 136 electrically coupling $MN_{CS}$ die 108 to carrier RF power die 110 (FIG. 8) project upwardly from dies 108, 110 into a region of space between lateral isolation wings 126, 127. The provision of lateral isolation wings 128, 129 thus provides additional electrical isolation or EM shielding between the input and output sides of IC dies 108-111 and the associated wirebonds 132-138 for still further enhancements in the RF performance of PA package 22. Moreover, wirebonds 132, 134, 135, 137 can be readily sized, as appropriate, to compensate for added inductance by the provision of pillar contacts 116-119 in at least some embodiments of PA package 86.

Figure 4:
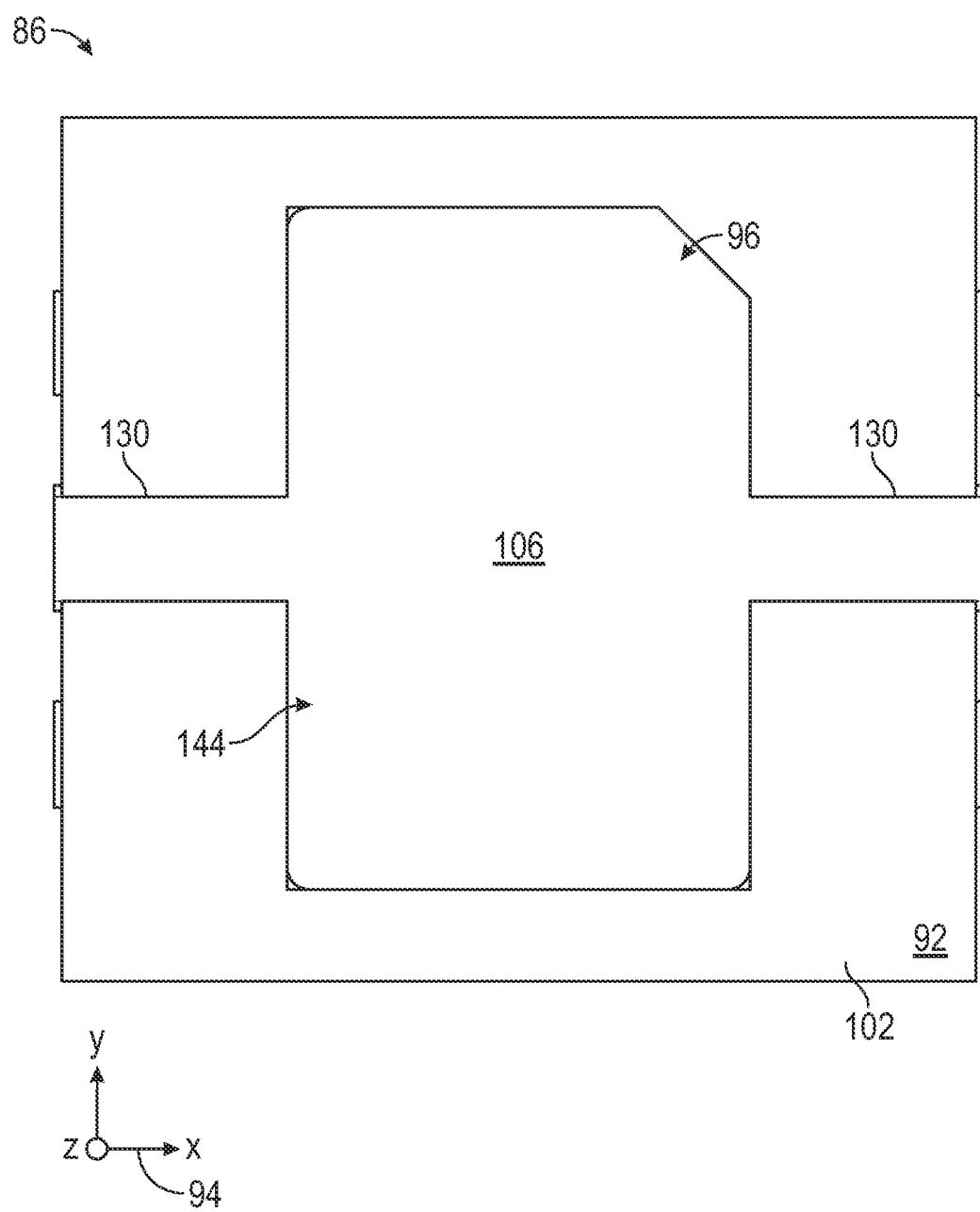
Figure 7:
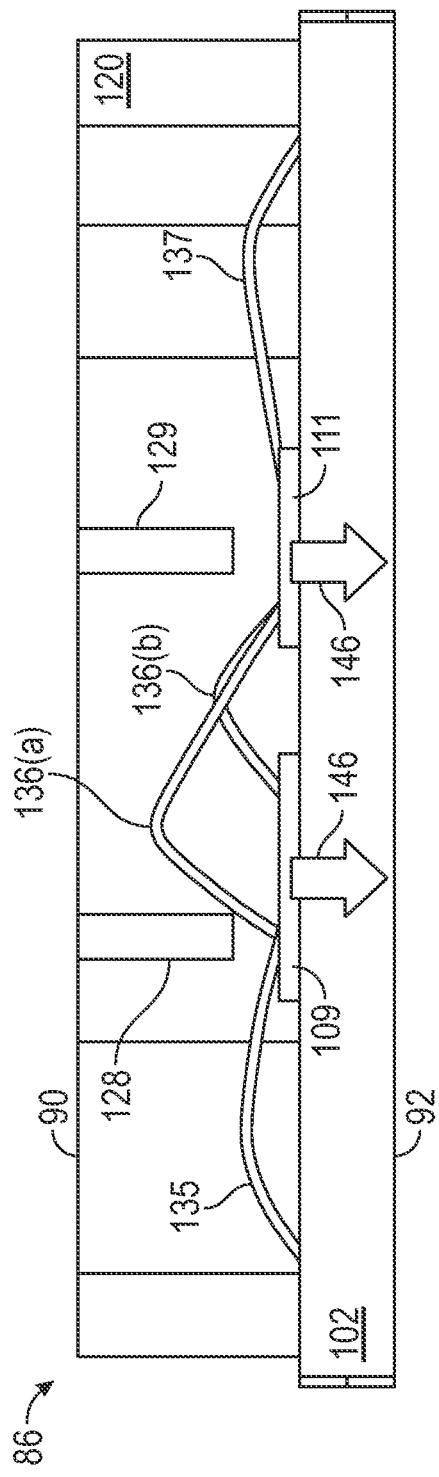
FIGS. 7 and 8 are opposing side views of the example leadless PA package shown in FIGS. 2-6 (rotated by 90 degrees about the package centerline relative to the side views of FIGS. 5 and 6), with the overmolded package body hidden from view.
Figure 8:
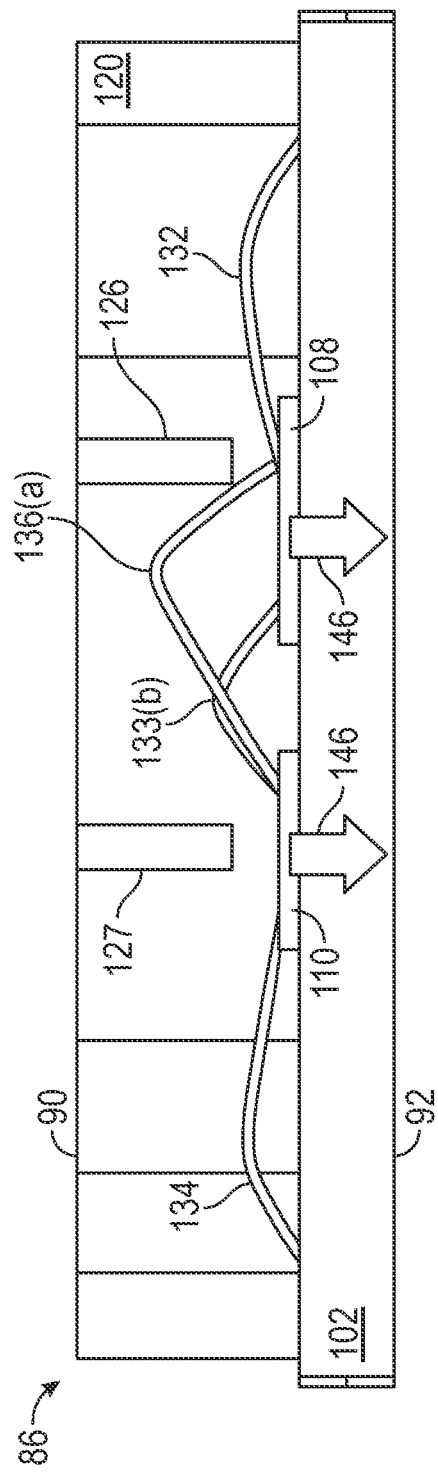
Figure 9:
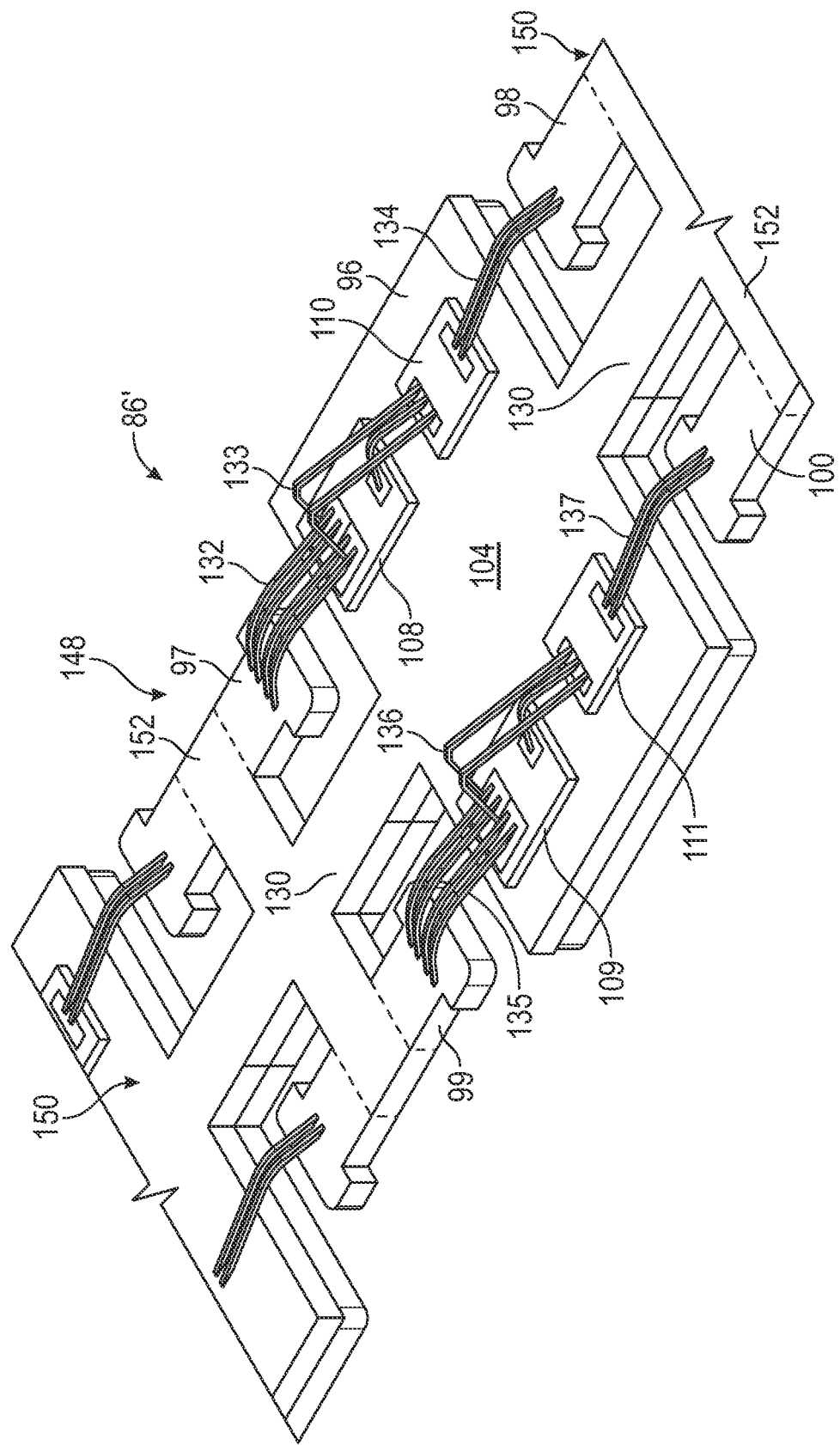
FIGS. 9-12 illustrate the example leadless PA package of FIGS. 2-8, as shown at various stages of manufacture and produced in accordance with an example fabrication process.

Embodiments of leadless PA package 22 may be further produced to include a bottomside thermal interface 144 (FIG. 4). Bottomside thermal interface 144 is formed by exposing lower flange surface 106 through package bottomside surface 92; e.g., in embodiments, lower flange surface 106 may be substantially coplanar with package bottomside surface 92 or, perhaps, may extend beyond package bottomside surface 92 by some amount. Comparatively, and as indicated by arrows 153 in FIGS. 5 and 6, pillar supports 97-100 are imparted with a reduced thickness (e.g., a half-etch feature) to ensure that pillar supports 97-100 do not extend fully to package bottomside surface 92 to prevent electrical bridging when and if an electrically-conducive assembly-level heatsink is placed in contact with package bottomside surface 92 and lower flange surface 106, as described below. As further indicated in FIGS. 7 and 8 by heat extraction arrows 146, a direct, dimensionally-robust heat extraction path is thus created extending from IC dies 109-111, through the thermally-conductive bond layers utilized to attach IC dies 109-111 to die mount surface 104 of base flange 96, and to low flange surface 106. An efficient, direct (non-tortuous), volumetrically robust thermal conduction path for transferring excess heat from IC dies 109-111, and particularly from RF power dies 110, 111, to an assembly-level heatsink external to leadless PA package 86, when such an assembly-level heatsink present within the larger electronic assembly in which PA package 18 is ultimately installed. In a general sense, the electrical and thermal paths of leadless PA package 22 are thus separated, progressing through PA package 22 in opposing directions to enable mounting of PA package 22 between an assembly-level substrate for electrical connection and an assembly-level heatsink for thermal dissipation. This, in effect, provides a highly effective thermal management solution to further optimize RF power die performance, particularly when RF power dies 110, 111 (and, most relevantly, carrier RF power die 110) is fabricated utilizing a power dense die technology, such as a GaN layered die structure. Additional description in this regard is provided below in connection with FIG. 13. First, however, examples of manufacturing processes suitable for fabricating leadless PA package 22 in combination with a plurality of similar PA packages is discussed in connection with FIGS. 9-12.

Figure 3:
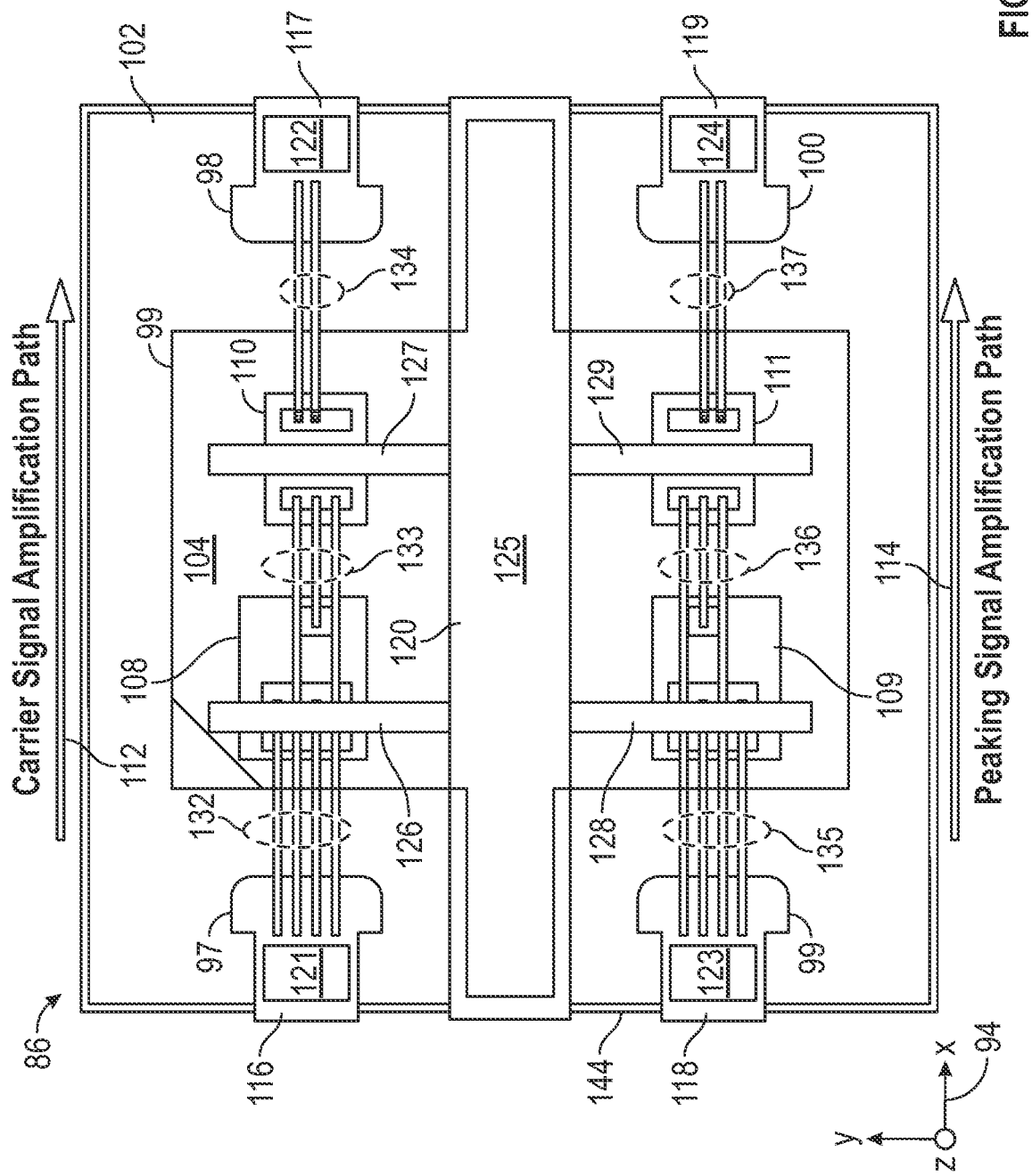
FIGS. 3 and 4 are topside and bottomside views, respectively, of the example leadless PA package shown in FIG. 2, with the overmolded package body hidden from view.

Example Methods for Fabricating a Leadless PA Package Having Topside Terminations FIGS. 9-12 illustrate example leadless PA package 86 shown in FIGS. 2-8 at various stages of manufacture. Referring initially to FIG. 3, leadless PA package 86 is shown in an intermediate stage of manufacture and is thus identified by reference numeral "86'," the prime symbol (') appended to reference numerals when denoting structural elements in an incomplete or partially-fabricated state. Additionally, leadless PA package 86 is fabricated utilizing a leadframe-based manufacturing approach in FIG. 9, with a limited region of a leadframe array 148 shown. Leadframe array 148 is processed to produce a plurality of addition leadless PA packages 150 in parallel with leadless PA package 86. The process steps described below in connection with leadless PA package 86' are performed globally across leadframe array 148; and, thus, should be understood as equally applicable to addition leadless PA packages 150 and the other non-illustrated leadless PA packages produced in parallel with leadless PA package 86. For this reason, FIGS. 10-12 focus on the portion of leadframe array 148 (namely, leadframe 96-100, 152) processed to specifically produced leadless PA package 86, while not illustrating the processing of leadframe 96-100, 152 (and the larger overmold panel, when produced) on a larger scale.

In the illustrated example embodiment, IC dies 108-111 are attached to base flange 96 included in leadframe 96-100, 152 and wirebonds 132-137 are formed prior to attachment of pillar contacts 121-124 and topside termination isolation structure 120, 126-129. Thus, IC dies 108-111 are placed in their desired positions on die mount surface 104 of base flange 96 and bonded thereto utilizing a suitable bonding material. In embodiments in which it is desired to electrically coupled one or more of IC dies 108-111 to base flange 96 (e.g., as in the case of carrier RF power die 110 and peaking RF power die 111), an electrically-conductive bonding material is utilized. In one embodiment, one or more sinter bond layers may be utilized and formed by depositing a sinter precursor material, which is subsequently cured to form sintered bond layers attaching one or more of IC dies 108-111 to base flange 96. Such sinter bond layers are also advantageously utilized to attach pillar contacts 121-124 and topside termination isolation structure 120, 126-129 to base flange 96 in embodiments. In other embodiments, a different electrically-conductive material may be utilized to provide mechanical and electrical connection to base flange 96, where desired, including solders and electrically-conductive die attach materials, such as metal-filled (e.g., Ag-filled) epoxies. IC dies 108-111 may be initially provided on tape and reel, or utilizing another media, and placed in their desired positions utilizing a pick-and-place tool. The chosen bonding material may be dispensed onto the appropriate locations of base flange 96 prior to die placement; and, following die placement, thermal or ultraviolet curing may be performed. After attachment of IC dies 108-111, a wirebonding technique, such as ball bonding, is conducted to produce wirebonds 132-137.

Figure 10:
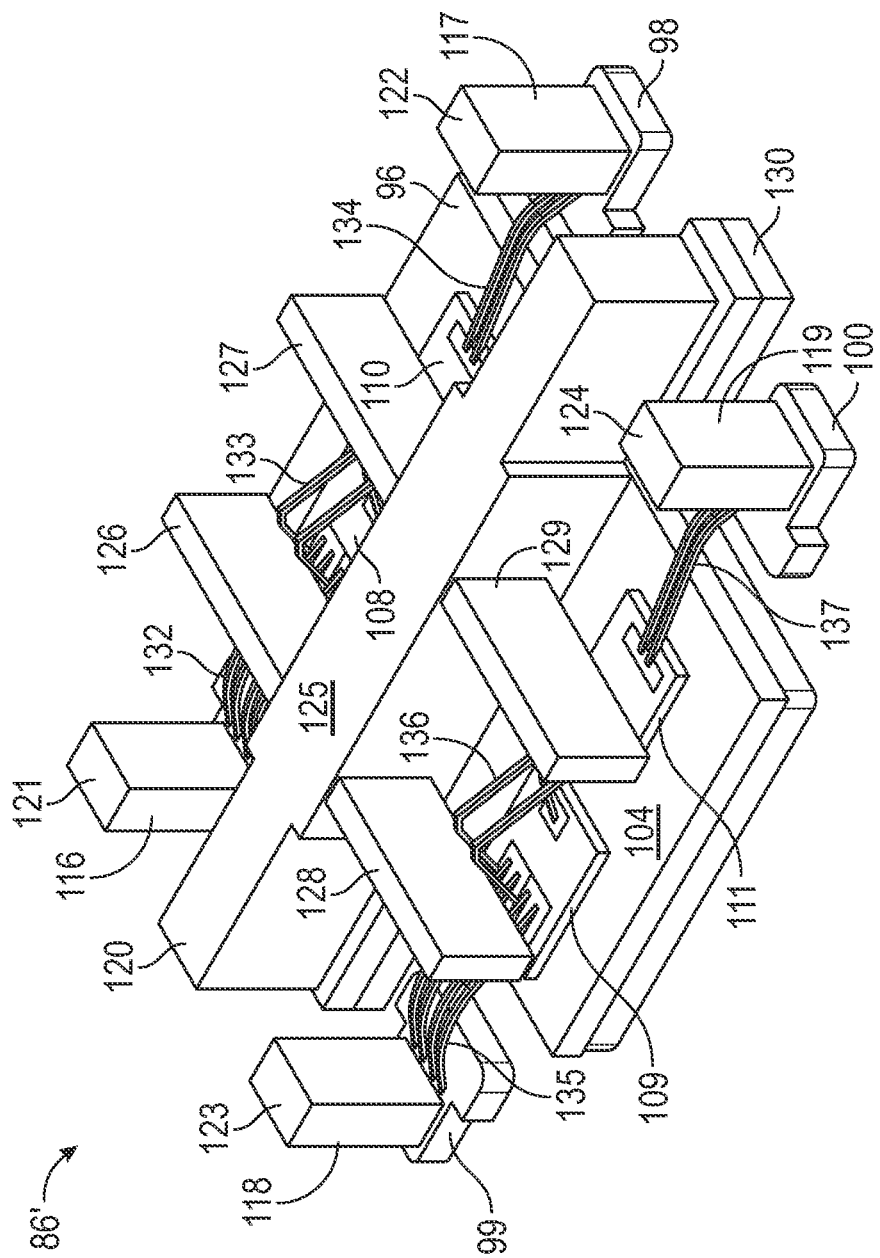
Figure 11:
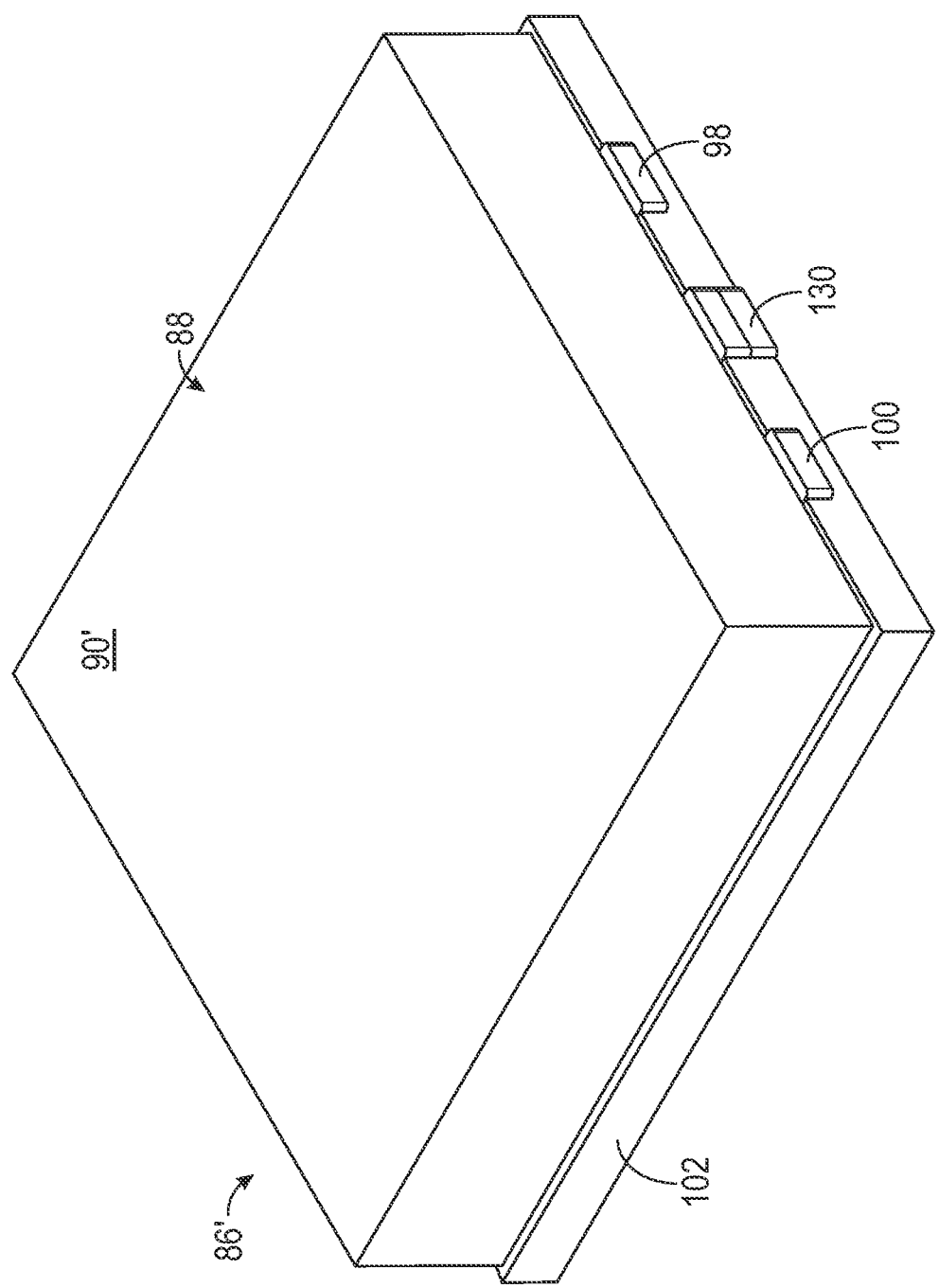
Figure 12:
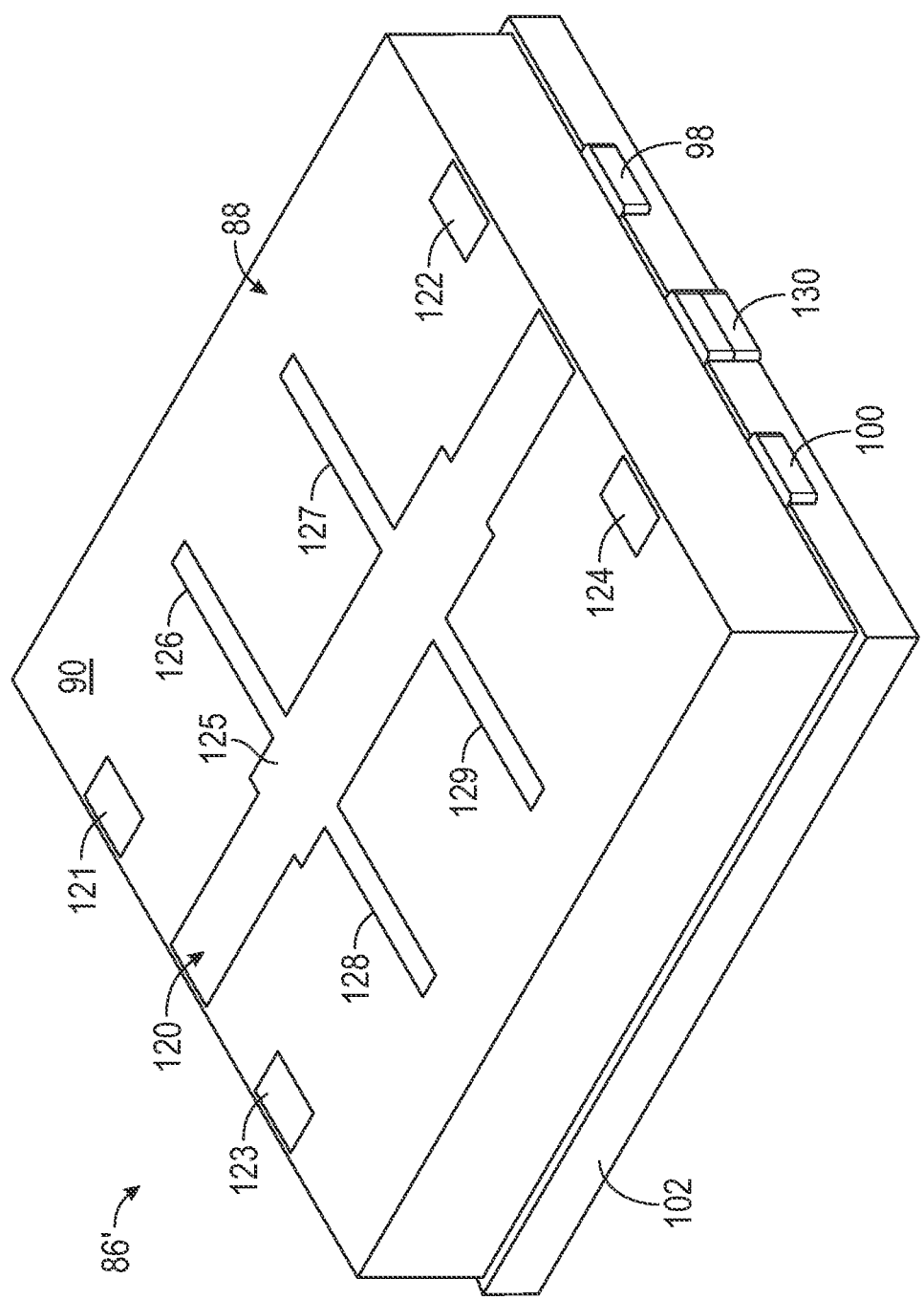

Referring next to FIG. 10, pillar contacts 121-124 and topside termination isolation structure 120, 126-129 are positioned onto pillar supports 97-100 and base flange 96, respectively. In the illustrated embodiment, pillar contacts 121-124 and topside termination isolation structure 120, 126-129 are placed as discrete units; however, in further embodiments, pillar contacts 121-124 and topside termination isolation structure 120, 126-129 may be positioned as an array. Again, an electrically-conductive bonding material is utilized to form the desired mechanical and electrical joints between pillar contacts 121-124 and topside termination isolation structure 120, 126-129 are positioned onto pillar supports 97-100 and base flange 96. As noted above, various electrically-conductive bonding materials can be utilized, including solder, metal-filled (e.g., Ag-filled) epoxies, and electrically-conductive die attach materials. In other embodiments, pillar contacts 121-124 and topside termination isolation structure 120, 126-129 may be joined to pillar supports 97-100 and base flange 96 utilizing sintered bond layers; that is, bond layers formed from sintered metallic particles and predominately composed of one or more metallic constituents, by weight. When formed from such sintered materials, the bond layers may be predominately composed of Cu, Ag, gold (Au), or a mixture thereof, by weight. Also, in such instances, the sintered bonds layers may or may not contain organic materials, such an epoxy added for strengthening purposes. In certain embodiments, a sinter precursor material is applied utilizing either a wet state or dry state (e.g., film) application technique. For example, in one approach, a sinter precursor material may be deposited onto selected regions of pillar supports 97-100 and base flange 96 by screen or stencil printing or utilizing fine needle dispense techniques. In other embodiments, a sinter precursor material may be applied (e.g., by spraying or dipping) to appropriate surfaces of pillar contacts 121-124 and topside termination isolation structure 120, 126-129 prior to seating onto pillar supports 97-100 and base flange 96. Curing may then be performed through low temperature heating (with or without the application of pressure) to transform the sinter precursor material into sinter bond layers forming metallurgical bonds at the various interfaces between pillar contacts 121-124; topside termination isolation structure 120, 126-129; pillar supports 97-100; and base flange 96.

Following attachment of pillar contacts 121-124 and topside termination isolation structure 120, 126-129, the above-described components included in partially-fabricated leadless PA package 86' and, more generally, leadframe array 148 are overmolded. Overmolding may involve dispensing a suitable encapsulant material (e.g., a thermosetting polymer) in a heated, flowable state. The overmold panel (including overmolded package body 88 shown in FIG. 11) is formed to have an excessive thickness or overburden, which fully encapsulates pillar contacts 121-124 and topside termination isolation structure 120, 126-129. After this, overmolded package body 88 (and, more broadly, the overmold panel) is thinned by removing material from package topside surface 90. A back-grinding process may be utilized for this purpose, with the term back-grinding encompassing various grinding and polishing processes suitable for removing material from overmolded package body 88 (and the overmold panel, generally) in a controlled manner. The topside package surface 90 is background to expose the respective upper terminal surfaces of pillar contacts 121-124 and topside termination isolation structure 120, 126-129, thereby yielding the topside I/O interface including topside I/O terminals 121-125 (shown in FIG. 12). If desired, the newly-exposed topside I/O terminals 121-125 may be electroplated to form a suitable plating finish on topside I/O terminals 121-125; and, perhaps, on other exposed metal regions of the partially-fabricated PA packages. Such plating layers can be composed of tin (Sn), nickel-palladium-gold (NiPdAu), or another metallic material in embodiments. Notably, such an electroplating process can be conducted by applying an electrical potential to leadframe array 148 itself, given that leadframe array 148 remains electrically coupled to pillar contacts 121-124 and topside termination isolation structure 120, 126-129 at the present juncture in the fabrication process. Finally, the overmold panel and leadframe array 148 are singulated (e.g., by sawing) to yield a plurality of leadless PA packages including leadless PA package 86. Singulation removes sacrificial portions 152 from leadframe array 148 (identified in FIG. 9) to electrically isolate pillar contacts 121-124 and topside termination isolation structure 120, 126-129. In further embodiments, sacrificial portions 152 may be reduced in one or more dimensions, grooves may be formed in the bottomside of sacrificial portions 152, or similar volume reduction modifications can be made to sacrificial portions 152 minimize the metal volume through which a saw blade passes during singulation of leadframe 96-100, 152.

The foregoing has thus described an example method for fabricating leadless PA package 86 in parallel with a plurality of similar PA packages. Further embodiments of the manufacturing process may differ in various respects. For example, in an alternative manufacturing approach, a bonding material, such as a metal particle-containing (e.g., Ag-containing) paste may be initially printed or otherwise dispensed in a desired pattern across leadframe array 148; IC dies 109-111, pillar contacts 121-124, topside termination isolation structure 120, 126-129 may then be positioned across leadframe array 148 and onto the appropriate mount locations of pillar supports 97-100 and base flange 96; and a global curing step may be performed to concurrently bond IC dies 109-111, pillar contacts 121-124, topside termination isolation structure 120, 126-129 to pillar supports 97-100 and base flange 96. Additional processing steps, such as plasma cleaning, may then be performed, followed by interconnection (e.g., wirebonding), overmolding, and singulation, as previously described. In other implementations, similar processing steps may be followed, while pillar contacts 121-124 and/or topside termination isolation structure 120, 126-129 are provided in the form of an interconnected array, which is separated into electrically-isolated portions in conjunction with singulation of leadframe array 148 and the overmolded panel. Alternatively, in other implementations, pillar contacts 121-124 and/or topside termination isolation structure 120, 126-129 may be integrally formed with leadframe array 148 to streamline manufacturing by the above-described pillar contact and isolation structure attachment steps (albeit with the potentially tradeoff of higher costs in manufacturing or purchasing the leadframe array itself). Finally, in still further implementations, leadless PA package 86 may be produced as an air cavity package rather than an overmolded or encapsulated package. For example, in this latter case, embodiments of the leadless PA package may be fabricated as a lidded air cavity package, with openings provided in the lid or cover piece of the PA package to allow contact to upper terminal ends of the pillar contacts including in the topside I/O interface. Such an approach may be practical when the PA packages are larger in size.

While primarily described above as electrically-conductive (e.g., metallic) blocks or similar structures, pillar contacts 121-124 can assume any form suitable for providing electrically-conductive paths from pillar supports 98-100 to the corresponding topside terminations 121-124. For example, in further implementations, pillar supports 98-100 can be provided in the form of electrically-routed substrates pieces or strips, such as substrate (e.g., single layer or multi-layer PCB) parts or pieces through which electrically-conductive features extend along the Z-axis of coordinate legend 94 shown in FIGS. 2-4 (generally parallel to the package height direction or the centerline of PA package 86). For example, pieces of a ceramic, PCB, or other base dielectric substrate can be fabricated to contain via clusters or farms, metallic coining, or similar electrically-conductive features allowing electrical connections vertically through the substrate pieces. Additionally, in such embodiments, grounded vias or similar electrically-grounded features can be formed in the routed substrate pieces to provide additional EMI shielding a targeted locations within leadless PA package 86; e.g., between the pillar contacts 121-124 conducting the gate and drain signals to FET circuits carried by RF power dies 110, 111. Such electrically-grounded features can assume the form of grounded vias, metallic coining, or other electrically-conductive features, which may fully surround the signal-carrying vias or coining in a co-axial relationship or, instead, may extend vertically along selected edges or sidewalls of the substrate pieces serving as pillar contacts 121-124, such as, the pillar sidewalls facing inwardly toward the package interior. Further, in such embodiments, a single piece or section of a routed substrate can be utilized to provide multiple pillar contacts when appropriately dimensions. For example, referring to the left side of PA package 86 in FIGS. 2 and 3, the left end of central isolation wall 120 may be shortened (or central isolation wall 120 may be omitted) to enable a single substrate piece having a generally rectangular planform shape to span the region occupied by pillar contacts 116, 118 in the illustrated example, with coining or via clusters formed at the appropriate locations in the substrate piece to serve as pillar contacts 116, 118. A similar approach can also be utilized to replace pillar contacts 117, 119 with a PCB, ceramic, or other substrate piece or strip at this location within the package body. Generally, then, pillar contacts 116-119 can be provided in a various forms enabling the desired electrical connection between pillar supports 98-100 to topside terminations 121-124, including one or more electrically-routed substrate pieces, as electrically-conductive (e.g., metallic) blocks, or as a combination thereof.

The statements in the preceding paragraph are equally applicable to topside termination isolation structure 120, 126-129 further contained in leadless PA package 86. In this latter regard, topside termination isolation structure 120, 126-129 can be provided as a monolithic or unitary electrically-conductive (e.g., Cu or other metallic) piece; as multiple electrically-conductive pieces, which are assembled in some manner; or as an electrically-routed substrate (e.g., a single layer or multi-layer PCB, a ceramic substrate, or other dielectric substrate) having vias, coining, or other electrically-conductive features, which vertically connect topside ground terminal 125 to base flange 96 and/or provide the above-described shielding functions. Further, in various implementations, a single, relatively large T- or I-shaped substrate piece (e.g., a PCB or other routed-substrate piece cut into the desired planform geometry) may span a region encompassing central isolation wall 120 and any combination of pillar contacts 116-119, with electrically-conductive features (e.g., vias, coining, or the like) formed at appropriate locations in the substrate piece to serve as or effectively form central isolation wall 120 and pillar contacts 116-119. In this manner, such a larger, electrically-routed substrate piece can be incorporated into leadless PA package 86 to provide the desired vertical interconnections between pillar supports 97-100 and topside terminations 121-124, as well as the desired vertical interconnection between base flange 96 and topside termination 125. Stated differently, in embodiments, electrically-conductive ground, gate, drain, and shield paths may be formed through a single PCB (or other substrate) piece, which may have an I-shaped geometry with (i) first gate, ground, and second gate conductive paths extending through the one end portion of the PCB; (ii) first drain, ground, and second drain extending through a second, opposing end portion of the PCB; and (iii) a ground-to-ground path extending from the first end portion to the second end portion. Various combinations of such structural approaches are also possible in further implementations of leadless PA package 86.

Figure 13:
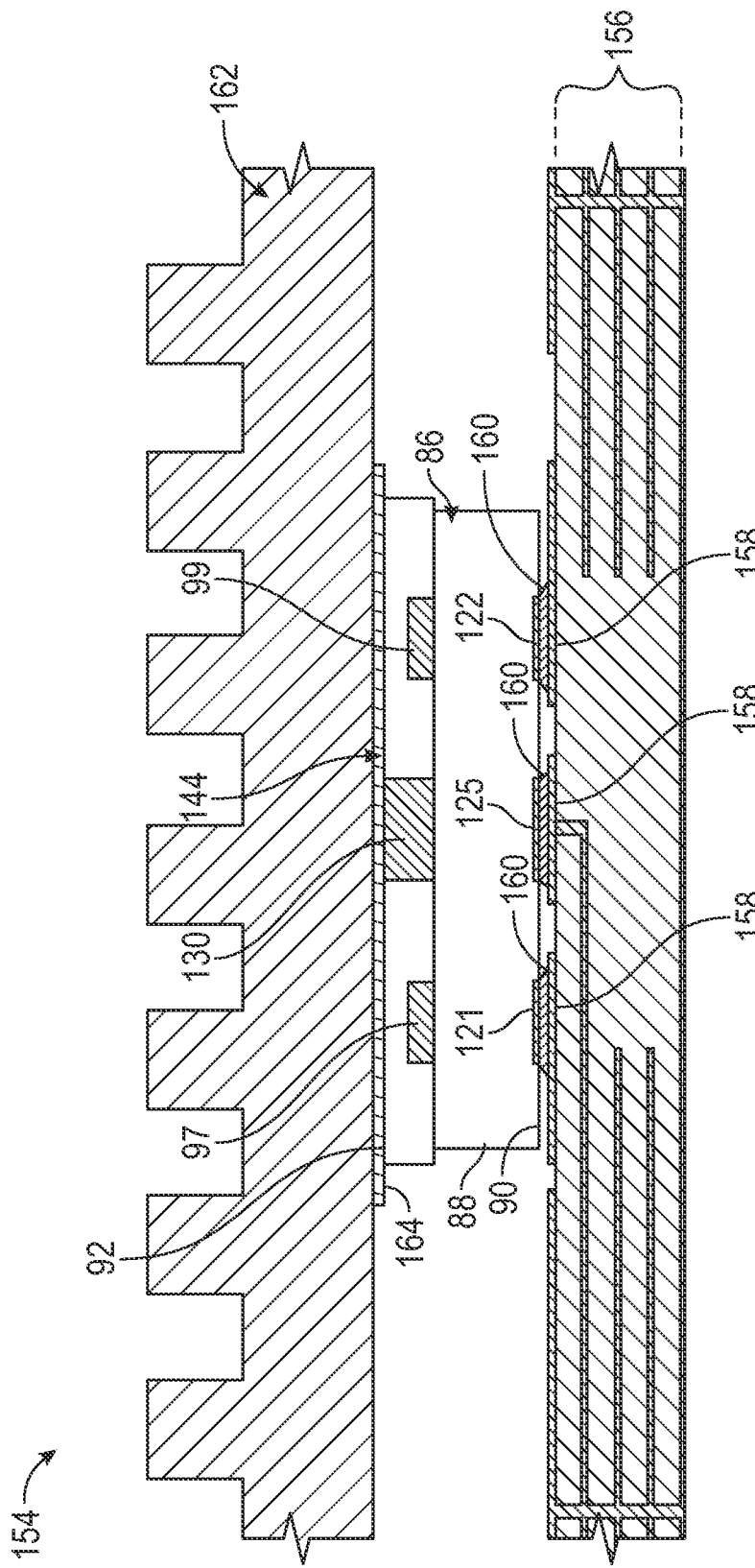
FIG. 13 illustrates one manner in which the example leadless PA package of FIGS. 2-8 may be installed within a larger electronic system or assembly in an inverted orientation, as illustrated in accordance with an example embodiment.

Example Installation of the Leadless PA Package in an Electronic System or Assembly FIG. 13 illustrates one manner in which leadless PA package 86 shown in FIGS. 2-8 may be installed within a larger electronic system or assembly 154, as illustrated in accordance with an example embodiment. Electronic assembly 154 includes an assembly-level substrate 156, such as a motherboard, to which PA package 86 is mounted in an inverted orientation such that package topside surface 131 faces assembly-level substrate 156. The topside I/O interface of PA package 86 is electrically coupled to corresponding interconnect features (e.g., bond pads and traces) on the upper surface of assembly-level substrate 156 utilizing any suitable interconnection technique, such as solder connection (noting solder bodies 160) to an LGA 158. In other embodiments, a patterned solder layer, a pin grid array (PGA), or a ball grid array (BGA) may be utilized to mount PA package 86 to and electrically interconnect PA package 86 with assembly-level substrate 156. Further, only a limited portion of assembly-level substrate 156 is shown in FIG. 13 for clarity. Various other components may be distributed across the non-illustrated portions of assembly-level substrate 156 to form the desired circuit structure.

An assembly-level heatsink 162 may be mounted directly to bottomside surface 92 of PA package 86 and bonded to bottomside thermal interface 144 (FIG. 4) utilizing, for example, a thermally-conductive bond layer 164 in embodiments. Thermally-conductive bond layer 164 can be composed of any thermally-conductive bonding material, such as a sintered bond layer or another bonding material (whether electrically conductive or dielectric) having a relatively low thermal resistance. In other embodiments, assembly-level heatsink 162 may be thermally coupled to bottomside thermal interface 144 in a less direct manner. For example, in other instances, assembly-level heatsink 162 may be spatially separated from PA package 86 and a thermal conduit, such as a metallic body or an elongated heat pipe, may be thermally coupled between heatsink 162 and bottomside thermal interface 144. Regardless of its particular location relative to PA package 86, assembly-level heatsink 162 can be any thermally-conductive structure or device suitable for absorbing excess heat extracted from PA package 86 through bottomside thermal interface 144. For example, in embodiments, assembly-level heatsink 162 may be a metal chassis, a fin structure (e.g., a pin-fin array), or another thermally-conductive body external to PA package 86. Assembly-level heatsink 162 may be convectively cooled by releasing heat to the ambient environment; and, in certain embodiments, a fan may direct airflow against assembly-level heatsink 162 to promote convective heat transfer to the impinging airflow. It is also possible for assembly-level heatsink 162 to be actively cooled utilizing a liquid coolant in embodiments. Generally, then, assembly-level heatsink 162 can assume different forms and configurations depending upon the characteristics of electronic assembly 154. It is also possible for PA package 86 to be installed within a larger electronic system or assembly, while bottomside thermal interface 144 is left exposed (and thus not directly thermally coupled to a heatsink) if such an arrangement provides sufficient heat dissipation from PA package 86 in certain applications.

Additional Examples of Leadless PA Package Having Topside Terminations

Figure 14:
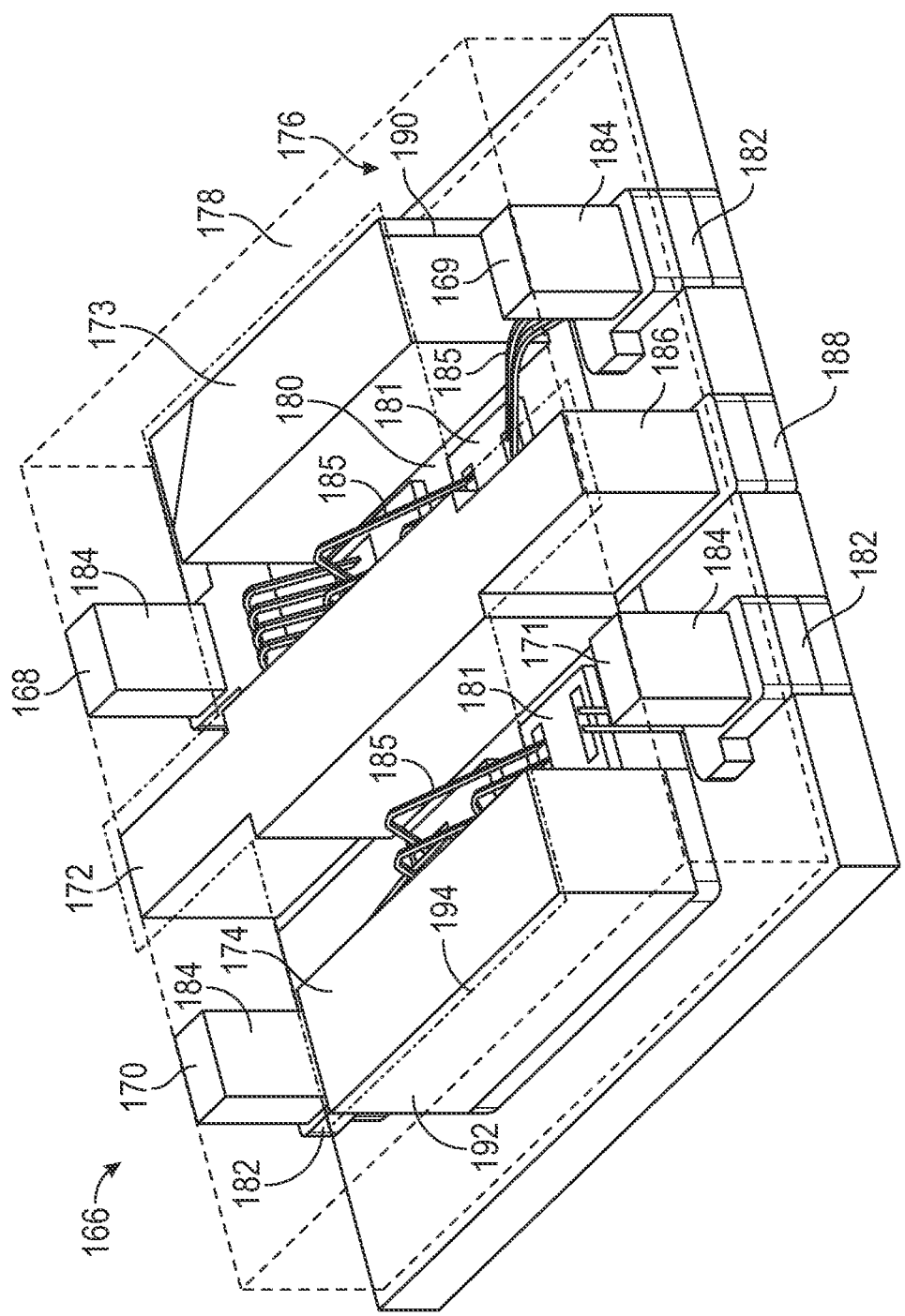
FIG. 14 is an isometric view of a leadless PA package including a topside I/O interface and an overmolded package body (shown in phantom line) and a topside termination isolation structure, as illustrated in accordance with a further example embodiment of the present disclosure.

FIG. 14 is an isometric view of a leadless PA package 166, as illustrated in accordance with a further example embodiment of the present disclosure. In many respects, leadless PA package 166 is similar to leadless PA package 86 described above in connection with FIGS. 2-8. For example, leadless PA package 166 includes a topside I/O interface 168-174 and an overmolded package body 176 (shown in phantom) at least partially defining a package topside surface 178. A base flange 180 is embedded in overmolded package body 176, as are a number of pillar supports 182. Contact pillars 184 are again joined to pillar supports 182 and extend away therefrom to package topside surface 178 to define terminals 168-171 included in topside I/O interface 168-174. A number of IC dies 181 are bonded to base flange 180 and interconnected with each other and with pillar supports 182, as appropriate, by wirebonds 185. Parallel signal amplification paths, such as parallel peaking and carrier signal amplification paths, are thus formed through leadless PA package 166. Specifically, a first (e.g., carrier) signal amplification is provided extending from topside terminal 170 to topside terminal 171, extending through the corresponding pillar contacts 184, pillar supports 182, wirebonds 185, and IC dies 181. A second (e.g., peaking) signal amplification is likewise formed to extend from topside terminal 168 to topside terminal 169, extending through the corresponding pillar contacts 184, pillar supports 182, wirebonds 185, and IC dies 181. Further, although hidden from view in FIG. 14, the bottom surface of flange 180 may be exposed through, and perhaps may be substantially coplanar with, the package bottomside surface of leadless PA package 166 to form a bottomside thermal interface analogous to that described in connection with FIG. 4 for dissipating excess heat generated by IC dies 181 during usage of leadless PA package 166.

Leadless PA package 166 further includes a central isolation wall 186, which extends over and substantially across base flange 180 including flange tie bars 188. In the example of FIG. 14, leadless PA package 166 also includes two additional peripheral isolation walls 190, 192, which are located adjacent opposing sidewalls of overmolded package body 176 and which extend substantially parallel to central isolation wall 186. Peripheral isolation walls 190, 192 flank or extend alongside the signal amplification paths extending from topside terminals 168-171 such that at least a majority of each signal amplification path is positioned between one of peripheral isolation walls 190, 192 and central isolation wall 186 to provide additional EM shielding in lateral directions. Additionally, peripheral isolation walls 190, 192 may further extend from base flange 180 to package topside surface 178 to form additional topside peripheral ground terminals 173, 174 in combination with central topside ground terminal 172 defined by the exposed upper surface of central isolation wall 186. Cumulatively, topside ground terminals 172-174 may provide a volumetrically robust electrical connection for grounding base flange 180 by bonding to one or more corresponding pads, lands, or similar features provided on an assembly-level substrate. An example plus-shaped geometry of such a pad or land to which topside ground terminals 172-174 may be electrically mounted when leadless PA package 166 is installed within a larger electronic system or assembly is represented in FIG. 14 by a dashed outline 194. While lacking lateral isolation wings in the illustrated example, leadless PA package 166 can be produced to include lateral isolation wings similar to those described above in connection with FIGS. 2-8 in further embodiments. When provided, such isolation wings may extend between and bridge isolations walls 186, 190, 192 to form a single lattice-like structure. In still other embodiments, any or all of isolation walls 186, 190, 192 may be omitted from leadless PA package 166.

Conclusion

Leadless PA packages having topside terminations, and methods for fabricating such leadless PA packages, have been provided. Embodiments of the leadless packages can be fabricated to include pillar contacts and pillar supports, which facilitate the formation of topside I/O interfaces utilizing reliable, cost-effective manufacturing processes; e.g., leadframe-based processing, global overmolding, and streamlined electroplating techniques. Additionally, embodiments of the leadless PA packages may include bottomside thermal interfaces, separating the primary heat dissipation path from the electrical signal paths of the PA package to improve thermal performance, while facilitating installation in larger electronic assemblies or systems. Unique in-package, topside termination isolation structures may further be deployed within the PA packages, including electrically-active (e.g., grounded) central isolation walls, for enhanced EM shielding and RF performance benefits. In certain embodiments, smaller fin-like transverse walls or "isolation wings," may further be provided to project over targeted regions of the packaged RF power dies (and possibly other IC dies) for additional input-to-output shield. The end result is leadless PA packages (e.g., DFN or QFN packages) having optimal RF and thermal performance characteristics, while amenable to production utilizing streamlined fabrication processes.

In embodiments, a method for fabricating a leadless PA package, such as QFN or DFN package, includes the step or process of providing electrically-conductive pillar supports and a base flange spaced from the electrically-conductive pillar supports; e.g., by obtaining the pillar supports and the base flange (e.g., by independent fabrication or purchase from a supplier), and by placing the pillar supports and the base flange on working surface in, for example, a leadframe format. The base flange has a die mount surface and a lower flange surface, which is located opposite the die mount surface in a package height direction (parallel to an axis orthogonal to the die mount surface). One or more IC dies are attached to the die mount surface of the base flange, with at least one of the IC dies comprising a RF power die; e.g., when the leadless PA package is produced to contain a Doherty amplifier layout, carrier and peaking RF power dies are attached to the base flange utilizing, for example, an electrically conductive bonding material. The IC die or dies (at least a first RF power die) and the electrically-conductive pillar supports are electrically interconnected by wirebonding or utilizing another suitable interconnection technique. Before or after electrically interconnecting the IC dies and the electrically-conductive pillar supports, pillar contacts are provided (e.g., placed as discrete bodies, such as metallic blocks), which are electrically coupled to the electrically-conductive pillar supports and which project from the pillar supports in the package height direction. The IC die or dies are overmolded or otherwise enclosed in a package body, which at least partially defines a package topside surface opposite the lower flange surface. Topside I/O terminals are formed, which are accessible from the package topside surface and electrically interconnected with the IC dies through the pillar contacts and the electrically-conductive pillar supports. In various embodiments in which the leadless PA package is fabricated to include an overmolded package body, the topside I/O terminals may be formed by exposing upper terminal surfaces of the pillar contacts (and possibly a central isolation wall) utilizing a back-grinding process.

In further embodiments, a method for fabricating a leadless PA package includes the steps or processes of providing a base flange having a die mount surface; attaching a peaking radio frequency (RF) power die to the base flange at a first die mount location and a carrier RF power die to the base flange at a second die mount location; and joining a central isolation wall to the die mount surface of the base flange such that the central isolation wall is electrically coupled to the base flange and extends between the first and second die mount locations. The peaking RF power die and the carrier RF power die are enclosed in a package body having a package topside surface, which is located opposite the base flange and which may extend substantially parallel to the die mount surface. A topside I/O interface is produced to be accessible from the package topside surface. The topside I/O interface includes a topside ground terminal electrically coupled to the peaking RF power and the carrier RF power die through the central isolation wall and the base flange. In at least some implementations, the method further includes the steps or processes of: (i) providing pillar contacts electrically coupled to the peaking RF power die and to the carrier RF power die; and (ii) encapsulating the pillar contacts, the base flange, the peaking RF power die, the carrier RF power die, and the central isolation wall in an overmolded package body having a thickness sufficient to cover upper terminal surfaces of the pillar contacts and the central isolation wall. In such implementations, the step or process of forming may include removing material from the overmolded package body to expose the upper terminal surfaces of the pillar contacts and the central isolation wall through the package topside surface.

Leadless PA packages have been further disclosed; and, in one embodiment, the leadless PA package includes a base flange having a die mount surface and a lower flange surface, which is located opposite the die mount surface in a package height direction. Electrically-conductive pillar supports are spaced from the base flange, while one or more IC dies (including or consisting of at least one RF power die) are attached to the die mount surface of the base flange and electrically interconnected with the electrically-conductive pillar supports. Pillar contacts are electrically coupled to the electrically-conductive pillar supports and projecting therefrom in the package height direction, and a package body encloses the IC die or dies (e.g., at least one RF power die) and has a package topside surface opposite the lower flange surface. The package topside surface may extend substantially parallel to the die mount surface in at least some instances. Topside I/O terminals are accessible from the package topside surface and are electrically interconnected with the IC die or dies through the pillar contacts and the electrically-conductive pillar supports. Further, in certain realizations, the package body assumes the form of an overmolded package body having an outer principal surface at least partially defining the package topside surface, and the topside I/O terminals assume the form of terminal end surfaces of the pillar contacts (plated or non-plated), which are exposed along and substantially coplanar with the outer principal surface of the overmolded package body. In still other embodiments, the pillar contacts include a first pair of pillar contacts located adjacent a first sidewall of the package body, as well as a second pair of pillar contacts located adjacent a second sidewall of the package body opposite the first sidewall. Comparatively, the central isolation wall includes: (i) a first end portion extending between the first pair of the pillar contacts; (ii) a second portion extending between the second pair of the pillar contacts; and (iii) an intermediate portion located between the first end portion and the second end portion, with a peaking RF power die and a carrier RF power die located on opposing sides of the intermediate portion of the central isolation wall.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A method for fabricating a leadless power amplifier (PA) package, the method comprising:
    providing electrically-conductive pillar supports and a base flange spaced from the electrically-conductive pillar supports, the base flange having a die mount surface and a lower flange surface opposite the die mount surface in a package height direction;
    attaching a first radio frequency (RF) power die to a first die mount location on the die mount surface of the base flange;
    attaching a second RF power die to a second die mount location on the die mount surface of the base flange;
    joining and electrically coupling a central isolation wall to the base flange such that the central isolation wall extends between the first die mount location and the second die mount location;
    electrically interconnecting the first RF power die and the second RF power die to the electrically-conductive pillar supports;
    before or after electrically interconnecting the first RF power die and the second RF power die to the electrically-conductive pillar supports, providing pillar contacts electrically coupled to the respective electrically-conductive pillar supports and projecting therefrom in the package height direction;
    enclosing the first RF power die, the second RF power die, and the central isolation wall in a package body defining, at least in substantial part, a package topside surface located opposite the lower flange surface, the package topside surface extending substantially parallel to the die mount surface; and
    forming topside input/output (I/O) terminals accessible from the package topside surface and electrically interconnected with the first RF power die and the second RF power die through the pillar contacts and the respective electrically-conductive pillar supports.

2. The method of claim 1, further comprising producing the package body to enclose the first RF power die and at least a portion of the pillar contacts, while exposing outer terminal surfaces of the pillar contacts from the package topside surface to form at least a portion of the topside I/O terminals.

3. The method of claim 2, wherein producing the package body comprises:
    encapsulating the electrically-conductive pillar supports, the base flange, the first RF power die, and the pillar contacts in an overmolded package body having a thickness sufficient to cover the pillar contacts; and
    after encapsulating the electrically-conductive pillar supports, the base flange, the first RF power die, and the pillar contacts, thinning the overmolded package body to expose the outer terminal surfaces of the pillar contacts at the package topside surface.

4. The method of claim 1, further comprising:
    providing the electrically-conductive pillar supports and the base flange as a part of a leadframe, the leadframe further including a sacrificial leadframe portion joining the electrically-conductive pillar supports and the base flange; and
    after enclosing the first RF power die in the package body, singulating the leadframe to remove the sacrificial leadframe portion and electrically isolate the base flange from the electrically-conductive pillar supports.

5. The method of claim 4, wherein the leadframe is provided as part of a leadframe array further including a plurality of additional interconnected leadframes;
    wherein the method further comprises plating terminal surfaces of the pillar contacts utilizing an electroplating process during which an electrical potential is applied to the pillar contacts through the leadframe array prior to singulation of the leadframe array.

6. The method of claim 1, further comprising imparting the package body with a package bottomside surface through which the lower flange surface is exposed to yield a bottomside thermal interface located substantially opposite the topside I/O terminals in the package height direction.

7. The method of claim 1, wherein the first RF power die comprises a peaking RF power die, and the second RF power die comprises a carrier RF power die; and
    wherein the method further comprises:
        producing the leadless PA package to have a Doherty amplifier architecture including a peaking signal amplification path and a carrier signal amplification path.

8. The method of claim 7, wherein the central isolation wall comprises a first end portion, a second end portion, and an intermediate portion between the first and second end portions;
    wherein the method further comprises producing the leadless PA package such that: (i) the first end portion of the central isolation wall extends between a first pair of the pillar contacts, (ii) the second end portion of the central isolation wall extends between a second pair of the pillar contacts, and (iii) the intermediate portion of the central isolation wall extends between the peaking RF power die and the carrier RF power die.

9. The method of claim 8, wherein the first and second end portions of the central isolation wall terminate adjacent first and second sidewalls of the package body, respectively; and
    wherein the method further comprises selecting the base flange to include flange tie bars extending substantially parallel to the central isolation wall and to the first and second sidewalls of the package body.

10. The method of claim 1, further comprising: and
providing a ground terminal accessible from the package topside surface, the base flange electrically coupled to the ground terminal through the central isolation wall.

11. The method of claim 1, wherein the central isolation wall is elongated in a package length direction; and
wherein the method further comprises providing a lateral isolation wing extending from the central isolation wall along an axis substantially perpendicular to the package length direction and the package height direction.

12. The method of claim 11, further comprising positioning the lateral isolation wing to extend over the first RF power die or the second RF power die, while spaced therefrom by an isolation gap measured in the package height direction.

13. A method for fabricating a leadless power amplifier (PA) package, the method comprising:
providing a base flange having a die mount surface;
attaching a peaking radio frequency (RF) power die to the base flange at a first die mount location and a carrier RF power die to the base flange at a second die mount location;
joining a central isolation wall to the die mount surface of the base flange such that the central isolation wall is electrically coupled to the base flange and extends between the first and second die mount locations;
enclosing the peaking RF power die and the carrier RF power die in a package body having a package topside surface opposite the base flange and extending substantially parallel to the die mount surface; and
forming a topside input/output (I/O) interface accessible from the package topside surface, the topside I/O interface comprising a topside ground terminal electrically coupled to the peaking RF power die and the carrier RF power die through the central isolation wall and the base flange.

14. The method of claim 13, further comprising:
providing pillar contacts electrically coupled to the peaking RF power die and to the carrier RF power die, respectively; and
encapsulating the pillar contacts, the base flange, the peaking RF power die, the carrier RF power die, and the central isolation wall in an overmolded package body having a thickness sufficient to cover upper terminal surfaces of the pillar contacts and the central isolation wall;
wherein forming comprises removing material from the overmolded package body to expose the upper terminal surfaces of the pillar contacts and the central isolation wall through the package topside surface.

15. The method of claim 13, further comprising:
providing a lateral isolation wing extending from the central isolation wall; and
positioning the lateral isolation wing to extend over the peaking RF power die or the carrier RF power die.

16. A method for fabricating a leadless power amplifier (PA) package, the method comprising:
providing electrically-conductive pillar supports and a base flange spaced from the electrically-conductive pillar supports, the base flange having a die mount surface and a lower flange surface opposite the die mount surface in a package height direction, wherein the die mount surface includes a first die mount location and a second die mount location;
joining a central isolation wall to the base flange such that the central isolation wall extends between the first die mount location and the second die mount location;
attaching a first radio frequency (RF) power die to the first die mount surface of the base flange;
electrically interconnecting the first RF power die and a first set of the electrically-conductive pillar supports;
attaching a second RF power die to the second die mount surface of the base flange;
electrically interconnecting the second RF power die and a second set of the electrically-conductive pillar supports;
before or after electrically interconnecting the first and second RF power dies and the first and second sets of electrically-conductive pillar supports, respectively, providing pillar contacts electrically coupled to the respective electrically-conductive pillar supports and projecting therefrom in the package height direction;
enclosing the first and second RF power dies and the central isolation wall in a package body defining, at least in substantial part, a package topside surface located opposite the lower flange surface, the package topside surface extending substantially parallel to the die mount surface; and
providing topside input/output (I/O) terminals accessible from the package topside surface and electrically interconnected with the first and second RF power dies through the pillar contacts and the electrically-conductive pillar supports, respectively.

17. The method of claim 16, further comprising:
providing the electrically-conductive pillar supports and the base flange as a part of a leadframe, the leadframe further including a sacrificial leadframe portion joining the electrically-conductive pillar supports and the base flange; and
after enclosing the first RF power die in the package body, singulating the leadframe to remove the sacrificial leadframe portion and electrically isolate the base flange from the electrically-conductive pillar supports.

18. The method of claim 17, wherein the leadframe is provided as part of a leadframe array further including a plurality of additional interconnected leadframes;
wherein the method further comprises plating terminal surfaces of the pillar contacts utilizing an electroplating process during which an electrical potential is applied to the pillar contacts through the leadframe array prior to singulation of the leadframe array.

19. The method of claim 16, wherein the first RF power die comprises a peaking RF power die of a Doherty amplifier, and the second RF power die comprises a carrier RF power die of the Doherty amplifier.

* * * * *